United States Patent
Shen et al.

(10) Patent No.: US 10,535,750 B2
(45) Date of Patent: Jan. 14, 2020

(54) SEMICONDUCTOR DEVICE MANUFACTURING METHOD WITH REDUCED GATE ELECTRODE HEIGHT LOSS AND RELATED DEVICES

(71) Applicants: Semiconductor Manufacturing International (Beijing) Corporation, Beijing (CN); Semiconductor Manufacturing International (Shanghai) Corporation, Shanghai (CN)

(72) Inventors: Zhaoxu Shen, Shanghai (CN); Jianhua Ju, Shanghai (CN); Shaofeng Yu, Shanghai (CN); Yang Liu, Shanghai (CN); YongMeng Lee, Shanghai (CN)

(73) Assignees: Semiconductor Manufacturing International (Beijing) Corporation (CN); Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 15/824,776

(22) Filed: Nov. 28, 2017

(65) Prior Publication Data
US 2018/0151696 A1    May 31, 2018

(30) Foreign Application Priority Data
Nov. 29, 2016    (CN) .......................... 2016 1 1066969

(51) Int. Cl.
*H01L 29/66*    (2006.01)
*H01L 21/283*    (2006.01)
(Continued)

(52) U.S. Cl.
CPC ...... *H01L 29/66545* (2013.01); *H01L 21/283* (2013.01); *H01L 21/3212* (2013.01);
(Continued)

(58) Field of Classification Search
CPC .................... H01L 29/66545; H01L 21/76801
See application file for complete search history.

(56) References Cited

U.S. PATENT DOCUMENTS

| 5,494,843 A * | 2/1996 | Huang | H01L 27/105 148/DIG. 82 |
| 9,117,842 B2 * | 8/2015 | Wei | H01L 21/82382 |

(Continued)

FOREIGN PATENT DOCUMENTS

CN    104795531 A    7/2015

OTHER PUBLICATIONS

European Search Report corresponding to EP17203753, Mar. 19, 2018, 1 page.
(Continued)

*Primary Examiner* — Cuong Q Nguyen
*Assistant Examiner* — Shih Tsun A Chou
(74) *Attorney, Agent, or Firm* — Innovation Counsel LLP

(57) ABSTRACT

A semiconductor device and its manufacturing method are presented. The manufacturing method includes providing a semiconductor structure comprising a substrate, at least one source region on the substrate, an interlayer dielectric layer covering a portion of the source region and having a cavity on the source region, and a pseudo gate insulation layer at the bottom of the cavity covering a portion of the source region; forming a barrier layer in the cavity; forming a loss reduction region in the interlayer dielectric layer by conducting an ion implantation process comprising silicon ion or carbon ion; removing the barrier layer; removing the pseudo gate insulation layer to expose a portion of the source region; and forming a gate structure on the exposed portion of the source region. This inventive concept reduces the loss of the interlayer dielectric layer, thus reduces the height loss of the gate electrode.

20 Claims, 14 Drawing Sheets

(51) Int. Cl.
*H01L 21/768* (2006.01)
*H01L 21/8234* (2006.01)
*H01L 29/10* (2006.01)
*H01L 29/165* (2006.01)
*H01L 29/49* (2006.01)
*H01L 21/321* (2006.01)

(52) U.S. Cl.
CPC ............... *H01L 21/76801* (2013.01); *H01L 21/823418* (2013.01); *H01L 29/1033* (2013.01); *H01L 29/165* (2013.01); *H01L 29/49* (2013.01)

(56) References Cited

U.S. PATENT DOCUMENTS

| | | | | |
|---|---|---|---|---|
| 2006/0079068 A1* | 4/2006 | Sheu | ................ | H01L 21/31144 438/433 |
| 2007/0072388 A1* | 3/2007 | Chen | ................ | H01L 21/76232 438/424 |
| 2012/0248550 A1* | 10/2012 | Huang | ............. | H01L 29/66545 257/410 |
| 2014/0015104 A1* | 1/2014 | Su | ........................ | H01L 21/225 257/611 |
| 2015/0168138 A1* | 6/2015 | Tian | ........................ | G03F 7/20 250/307 |
| 2015/0206949 A1* | 7/2015 | Zhao | ..................... | H01L 29/495 257/410 |
| 2016/0322469 A1* | 11/2016 | Bhalla | ............... | H01L 29/42368 |

OTHER PUBLICATIONS

Yonggen He, et al., "Investigation of Si Implantation into ILD (Interlayer Dielectric) for Film Property Modification", 2014 International Workshop i Junction Technology (IWJT), IEEE, May 18, 2014, 4 pages.

* cited by examiner

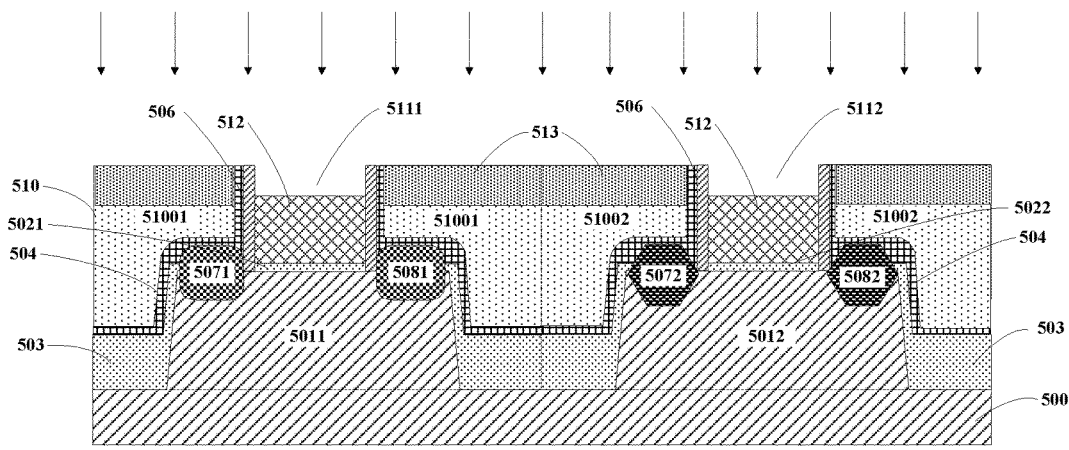
Fig. 5E
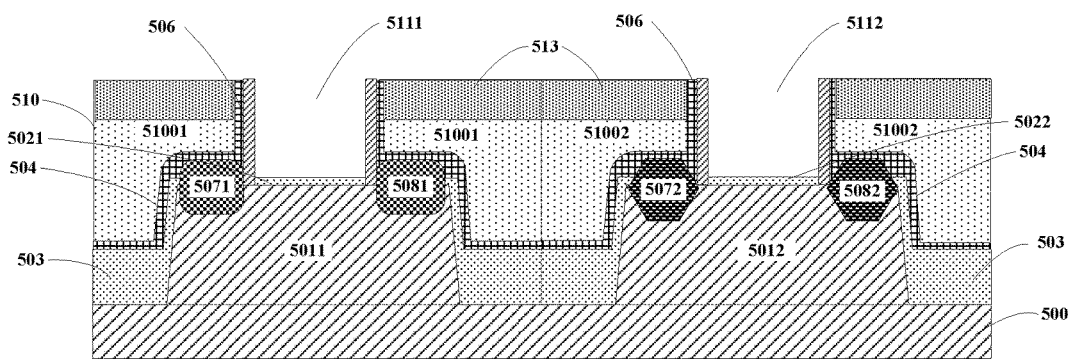
Fig. 5F
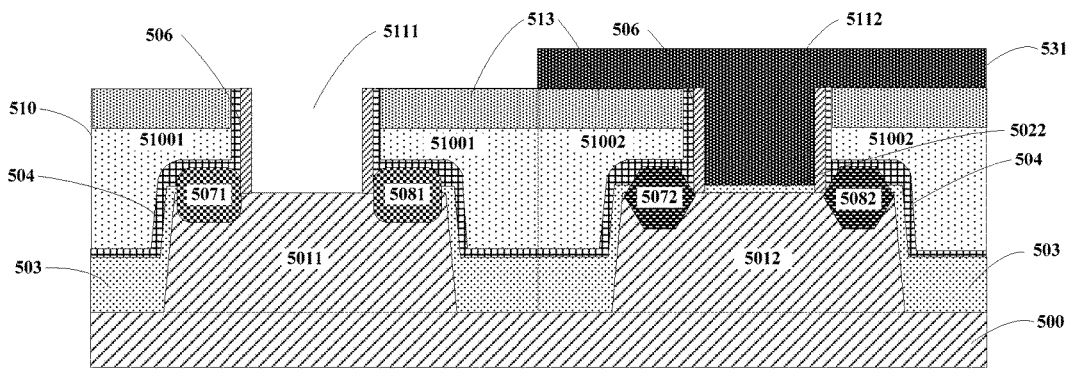
Fig. 5G1

SEMICONDUCTOR DEVICE MANUFACTURING METHOD WITH REDUCED GATE ELECTRODE HEIGHT LOSS AND RELATED DEVICES

CROSS-REFERENCE TO RELATED APPLICATION

This application claims priority to and benefit of Chinese Patent Application No. 201611066969.4 filed on Nov. 29, 2016, which is incorporated herein by reference in its entirety.

BACKGROUND

(a) Field of the Invention

This inventive concept relates to semiconductor technology and, more specifically, to a semiconductor device and its manufacturing method.

(b) Description of the Related Art

In conventional Metal Oxide Semiconductor Field Effect Transistor (MOSFET) manufacturing processes, a gate electrode is typically manufactured by a gate-last process, which is described below with reference to FIGS. 1A, 1B, 1C, and 1D.

Referring to FIG. 1A, a semiconductor fin 101, a Shallow Trench Isolation (STI) 102, and a well region (not shown in FIG. 1A) are first formed, then a pseudo gate structure is formed. The pseudo gate structure comprises a pseudo gate insulation layer 103, a pseudo gate electrode 104, and a hard mask layer 105. The pseudo gate electrode 104 has a height of $H_1$, as shown in FIG. 1A.

Next, referring to FIG. 1B, a spacer 106 is formed, and a source electrode 107 and a drain electrode 108 are epitaxially grown. Then an ion implantation process is conducted in the source electrode 107 and the drain electrode 108, a silicon nitride layer 109 covering the whole structure is formed, and an Interlayer Dielectric (ILD) layer 110 is deposited on the silicon nitride layer 109.

Next, referring to FIG. 1C, a planarization process is conducted on the structure of FIG. 1B to expose the pseudo gate electrode 104.

Next, referring to FIG. 1D, the pseudo gate electrode 104 and the pseudo gate insulation layer 103 are both removed to form a gate structure, which comprises a gate oxide layer 111, a high-K (K is the dielectric constant) dielectric layer 112 and a metal gate electrode 113. The process to form the gate structure comprises: forming the gate oxide layer 111 through an oxidation process; depositing the high-K dielectric layer 112 and a gate material layer 113; and conducting a Chemical Mechanical Planarization (CMP) process to form the gate structure. The gate material layer may comprise a work function regulation layer and a metal layer on the work function regulation layer. In some embodiments, the process to form the gate structure may further comprise a process to pre-clean the surface of the semiconductor fin 101 and a process to form an interlayer (IL) layer. After the gate structure is formed, the metal gate electrode 113 has a height of $H_2$, as shown in FIG. 1D.

Next, metal contact components (not shown in the figures) connecting the metal gate electrode, the source electrode, and the drain electrode are formed.

In the above-described manufacturing process, the metal gate electrode has a height loss of $H_1$-$H_2$, the height loss is largely due to the CMP process, the etching process, and the wet cleaning process that may be conducted in the planarization process to expose the pseudo gate electrode, the process to remove the pseudo gate electrode, the pre-clean process, and the CMP process on the gate structure.

In actual manufacturing process, a structure with too large $H_1$ may block the ion implantation process or cause the pseudo gate electrode to peel off; while a structure with too small $H_2$ may have a homogeneous issue as a result of drifts or variations in the heights of different devices. For example, when $H_2$ is too small, metal contact components may only contact the metal gate electrodes in some devices, but not in other devices. Hence, a small $H_1$ and a large $H_2$ are preferred in a gate manufacturing process.

Conventional manufacturing methods have a large height loss ($H_1$-$H_2$) in a gate electrode, thus a large $H_2$ also requires a large $H_1$, and a small $H_1$ also results in a small $H_2$.

SUMMARY

The inventors of this inventive concept investigate the large loss of the interlayer dielectric layer in conventional manufacturing methods, which leads to a large height loss of the gate electrode, and propose an innovative solution to remedy this issue.

This inventive concept presents both a semiconductor device and its manufacturing method. The inventive concept disclosed herein can reduce the loss of the interlayer dielectric layer in the manufacturing process and therefore reduce the height loss of the gate electrode.

This inventive concept first presents a semiconductor device manufacturing method, comprising:

providing a semiconductor structure, wherein the semiconductor structure comprises:
    a substrate;
    at least one source region on the substrate;
    an interlayer dielectric layer covering a portion of the source region, wherein the interlayer dielectric layer has a cavity on the source region; and
    a pseudo gate insulation layer at the bottom of the cavity covering a portion of the source region;
forming a barrier layer in the cavity;
forming a loss reduction region in the interlayer dielectric layer by conducting an ion implantation process comprising silicon ion or carbon ion on the semiconductor structure;
removing the barrier layer;
removing the pseudo gate insulation layer to expose a portion of the source region; and
forming a gate structure on the exposed portion of the source region.

Additionally, in the aforementioned method, the ion used in the ion implantation process may comprise silicon ion, carbon ion, or an ionic group comprising silicon or carbon.

Additionally, in the aforementioned method, providing a semiconductor structure may comprise:

providing an initial structure, wherein the initial structure comprises:
    a substrate;
    at least one source region on the substrate;
    a pseudo gate structure on the source region, wherein the pseudo gate structure comprises a pseudo gate insulation layer on the source region and a pseudo gate electrode on the pseudo gate insulation layer; and
    an interlayer dielectric layer around the pseudo gate structure, wherein the upper surface of the interlayer dielectric layer is on substantially the same horizontal level as the upper surface of the pseudo gate electrode; and removing the pseudo gate electrode to form a cavity.

Additionally, in the aforementioned method, the interlayer dielectric layer may comprise a first insulation layer on the source region and a second insulation layer on the first insulation layer, and providing a semiconductor structure may comprise:

providing an initial structure, wherein the initial structure comprises:
a substrate;
at least one source region on the substrate;
a pseudo gate structure on the source region, wherein the pseudo gate structure comprises a pseudo gate insulation layer on the source region and a pseudo gate electrode on the pseudo gate insulation layer; and
the first insulation layer around the pseudo gate structure, wherein the upper surface of the first insulation layer is on substantially the same horizontal level as the upper surface of the pseudo gate electrode;
removing the pseudo gate electrode to form a cavity; and
forming the second insulation layer on the first insulation layer and on the bottom and a sidewall of the cavity, wherein the barrier layer is formed on the second insulation layer.

Additionally, the aforementioned method may further comprise removing the second insulation layer in the cavity after the barrier layer is removed but before the pseudo gate insulation layer is removed.

Additionally, the aforementioned method may further comprise conducting a thermal annealing process on the semiconductor structure with the loss reduction region after the barrier layer is removed but before the second insulation layer in the cavity is removed.

Additionally, in the aforementioned method, the gate structure may comprise:
a gate insulation layer on the exposed portion of the source region;
a high-K dielectric layer on the gate insulation layer; and
a gate electrode on the high-K dielectric layer.

Additionally, in the aforementioned method, forming a gate structure on the exposed portion of the source region may comprise:
forming a gate insulation layer on the exposed portion of the source region;
forming a high-K dielectric layer on the gate insulation layer covering the semiconductor structure;
forming a gate material layer on the high-K dielectric layer; and
forming the gate structure by conducting a planarization process on the semiconductor structure after the gate material layer is formed.

Additionally, in the aforementioned method, the barrier layer may comprise a Bottom Anti-Reflective Coating (BARC) layer or a photoresist.

Additionally, in the aforementioned method, forming a barrier layer in the cavity may comprise:
forming a barrier layer filling the cavity on the semiconductor structure; and
removing a portion of the barrier layer so that the remaining barrier layer partially fills the cavity.

Additionally, in the aforementioned method, the source region may comprise a first source region for a first device and a second source region for a second device, the interlayer dielectric layer may comprise a first part of the interlayer dielectric layer covering a portion of the first source region and a second part of the interlayer dielectric layer covering a portion of the second source region, and the cavity may comprise a first cavity on the first source region and a second cavity on the second source region.

Additionally, in the aforementioned method, removing the pseudo gate insulation layer may comprise:
forming a hard mask layer on the second part of the interlayer dielectric layer and in the second cavity;
removing the pseudo gate insulation layer in the first cavity to expose a portion of the first source region; and
removing the hard mask layer.

Additionally, the aforementioned method may further comprise conducting a thermal annealing process on the semiconductor structure with the loss reduction region after the barrier layer is removed but before the hard mask layer is formed.

Additionally, in the aforementioned method, removing the pseudo gate insulation layer may comprise:
forming a cover layer on the second part of the interlayer dielectric layer and in the second cavity;
forming a hard mask layer on the cover layer;
removing the pseudo gate insulation layer in the first cavity to expose a portion of the first source region; and
removing the hard mask layer and the cover layer.

Additionally, the aforementioned method may further comprise conducting a thermal annealing process on the semiconductor structure with the loss reduction region after the barrier layer is removed but before the cover layer is formed.

Additionally, in the aforementioned method, removing the barrier layer may comprise:
removing the barrier layer in the first cavity,
and wherein removing the pseudo gate insulation layer comprises:
forming a hard mask layer on the second part of the interlayer dielectric layer and on the barrier layer in the second cavity;
removing the pseudo gate insulation layer in the first cavity to expose a portion of the first source region; and
removing the hard mask layer and the barrier layer in the second cavity.

Additionally, in the aforementioned method, removing the barrier layer may comprise:
removing the barrier layer in the first cavity,
and removing the pseudo gate insulation layer comprises:
forming a cover layer on the second part of the interlayer dielectric layer and on the barrier layer in the second cavity;
forming a hard mask layer on the cover layer;
removing the pseudo gate insulation layer in the first cavity to expose a portion of the first source region; and
removing the hard mask layer, the cover layer and the barrier layer in the second cavity.

Additionally, in the aforementioned method, forming a gate structure may comprise:
forming a gate insulation layer on the expose portion of the first source region;
forming a high-K dielectric layer in the first cavity and in the second cavity; and
forming a gate electrode on the high-K dielectric layer.

Additionally, in the aforementioned method, the semiconductor structure may further comprise:
a source electrode and a drain electrode in the source region and each at a side of the cavity; and
a spacer on a sidewall of the cavity.

Additionally, the aforementioned method may further comprise:
forming a groove around the source region,
and the semiconducting structure further comprises:
a third insulation layer at least partially filling the groove; and
a fourth insulation layer covering the third insulation layer, the source electrode, and the drain electrode, wherein the interlayer dielectric layer is formed on the fourth insulation layer.

Additionally, in the aforementioned method, the source region may be a semiconductor fin or a source region for a planar semiconductor device.

This inventive concept further presents a semiconductor device, comprising:
a substrate;
at least one source region on the substrate;
a gate structure on the source region;
an interlayer dielectric layer around the gate structure, wherein the interlayer dielectric layer has a loss reduction region formed by conducting an ion implantation process comprising silicon ion or carbon ion on the interlayer dielectric layer.

Additionally, in the aforementioned device, the gate structure may comprise:
a gate insulation layer on the source region;
a high-K dielectric layer on the gate insulation layer; and
a gate electrode on the high-K dielectric layer.

Additionally, in the aforementioned device, the upper surface of the interlayer dielectric layer may be on substantially the same horizontal level as the upper surface of the gate electrode.

Additionally, in the aforementioned device, the interlayer dielectric layer may comprise:
a first insulation layer covering a portion of the source region; and
a second insulation layer on the first insulation layer.

Additionally, in the aforementioned device, the source region may comprise:
a first source region for a first device; and
a second source region for a second device.

Additionally, the aforementioned device may further comprise:
a source electrode and a drain electrode in the source region and each at a side of the gate electrode; and
a spacer on the source region and located between the gate electrode and the source electrode, and between the gate electrode and the drain electrode.

Additionally, the aforementioned device may further comprise:
a groove around the source region;
a third insulation layer at least partially filling the groove; and
a fourth insulation layer covering the third insulation layer, the source electrode, and the drain electrode, wherein the interlayer dielectric layer is formed on the fourth insulation layer.

Additionally, in the aforementioned device, the source region may be a semiconductor fin or a source region for a planar semiconductor device.

BRIEF DESCRIPTION OF THE DRAWINGS

The drawings illustrate some embodiments of this inventive concept and will be used to describe this inventive concept along with the specification.

FIGS. 5A, 5B, 5C, 5D, 5E, 5F, 5G1, 5G2, 5H, and 5I show schematic sectional views illustrating different stages of a semiconductor device manufacturing method in accordance with one or more embodiments of this inventive concept.

FIGS. 7A, 7B, 7C, 7D, 7E, 7F, 7G1, 7G2, 7H, and 7I show schematic sectional views illustrating different stages of a semiconductor device manufacturing method in accordance with one or more embodiments of this inventive concept.

DETAILED DESCRIPTION OF THE EMBODIMENTS

Figure 1A:
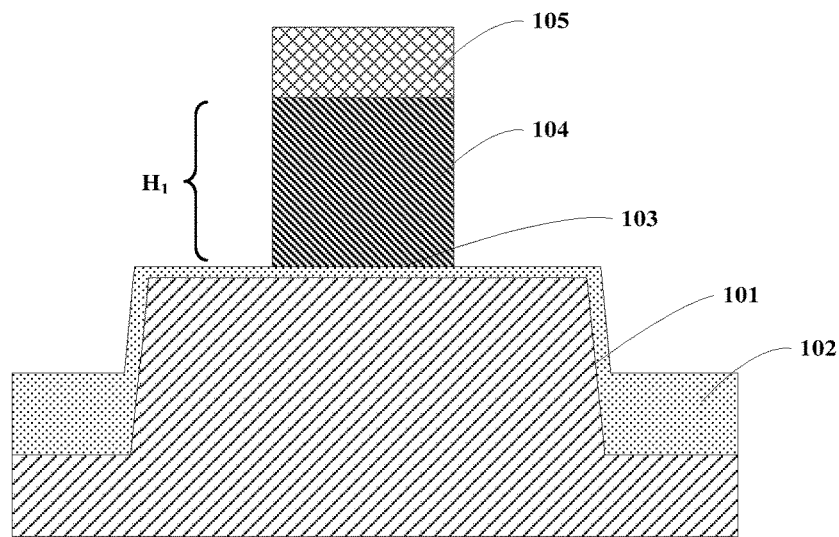
FIGS. 1A, 1B, 1C, and 1D show schematic sectional views illustrating different stages of a conventional MOSFET manufacturing process.
Figure 1B:
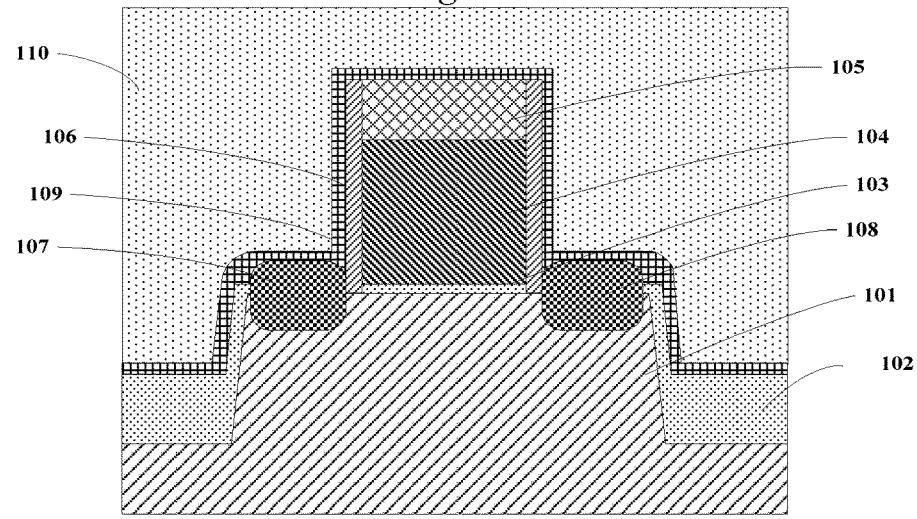
Figure 1C:
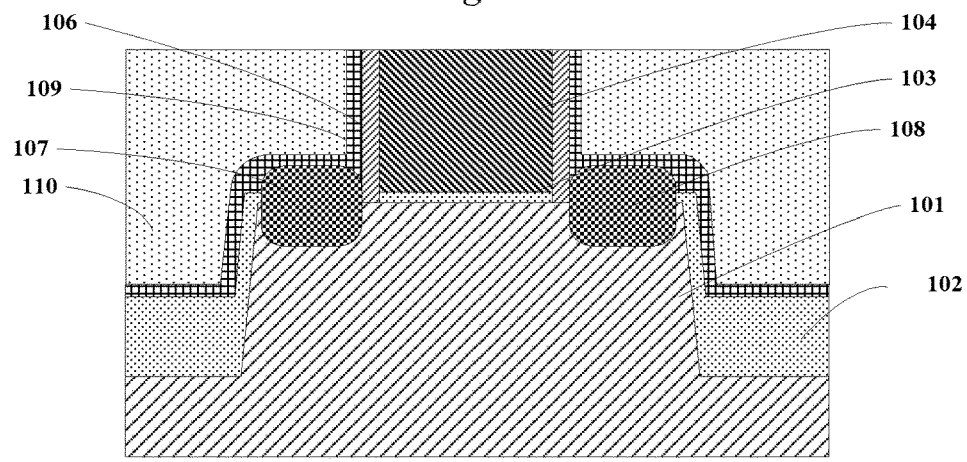
Figure 1D:
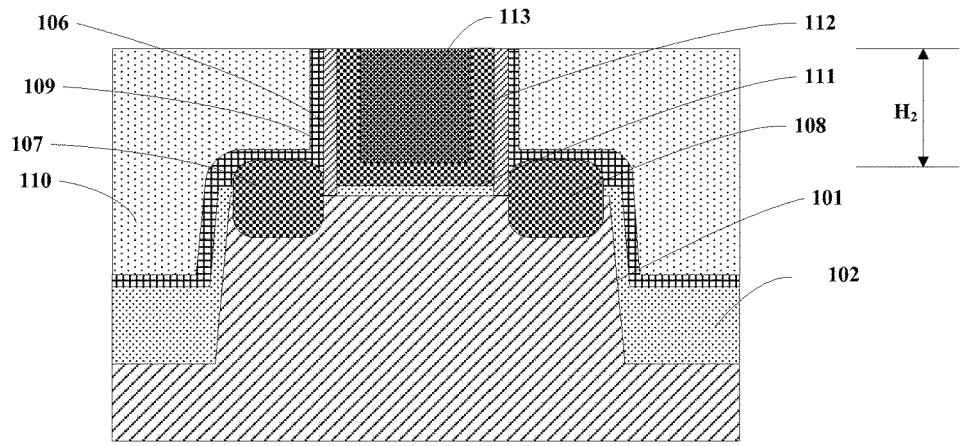

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc.

may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

Figure 2:
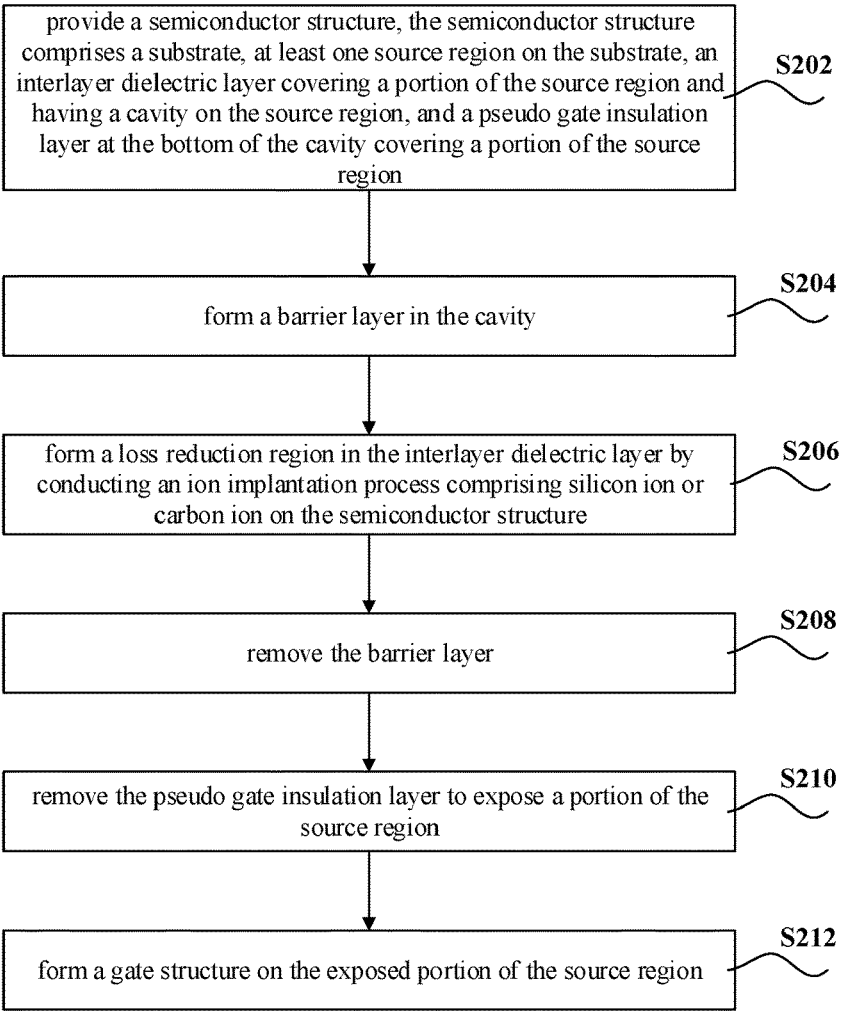
FIG. 2 shows a flowchart illustrating a semiconductor device manufacturing method in accordance with one or more embodiments of the inventive concept.

FIG. 2 shows a flowchart illustrating a semiconductor device manufacturing method in accordance with one or more embodiments of this inventive concept.

In step S202, a semiconductor structure is provided. The semiconductor structure comprises a substrate, at least one source region on the substrate; an interlayer dielectric layer covering a portion of the source region, wherein the interlayer dielectric layer has a cavity on the source region; and a pseudo gate insulation layer on the bottom of the cavity covering a portion of the source region.

In step S204, a barrier layer is formed in the cavity. For example, the barrier layer may comprise a Bottom Anti-Reflective Coating (BARC) layer or a photoresist.

In step S206, an ion implantation process comprising silicon ion or carbon ion is conducted on the semiconductor structure to form a loss reduction region in the interlayer dielectric layer. In some embodiments, the ions that are implanted in the ion implantation process may comprise silicon ion, carbon ion, or an ionic group comprising silicon or carbon.

In step S208, the barrier layer is removed.

In step S210, the pseudo gate insulation layer is removed to expose a portion of the source region.

In step 212, a gate structure is formed on the exposed portion of the source region. For example, the gate structure may comprise a gate insulation layer on the exposed portion of the source region, a high-K dielectric layer on the gate insulation layer, and a gate electrode on the high-K dielectric layer.

In some embodiments, the gate insulation layer may comprise silicon dioxide, the high-K dielectric layer may comprise a silicon nitride, aluminum oxide ($Al_2O_3$), yttrium oxide ($Y_2O_3$), lanthanum oxide ($La_2O_3$), tantalum pentoxide ($Ta_2O_5$), titanium dioxide ($TiO_2$), hafnium dioxide ($HfO_2$), or zirconium dioxide ($ZrO_2$). In some embodiments, the gate electrode may be made of a metallic material such as tungsten. The gate electrode may also comprise materials for work function regulation layer such as titanium nitride, tantalum nitride, or titanium aluminum alloy.

In the above-described embodiments of this inventive concept, a loss reduction region is formed in the interlayer dielectric layer by conducting an ion implantation process comprising silicon ion or carbon ion on the semiconductor structure, the loss reduction region can reduce the loss of interlayer dielectric layer, and reduce the height loss of the gate electrode, in the succeeding stages that involve an etching or a planarization process (for example, step S210 may involve an etching process and step S212 may involve a planarization process). Thus, this inventive concept allows a lower pseudo gate electrode and a higher gate electrode than those in conventional methods. Hence the manufacturing method of this inventive concept provides more manufacture margin than conventional methods and helps to improve production yield.

In the embodiments of this inventive concept, the source region may be either a semiconductor fin or a source region for a planar device. That it, this inventive concept can apply to either a fin-type semiconductor device or a planar semiconductor device. For conciseness, this inventive concept will be described using only examples where the source region is a semiconductor fin.

FIGS. 3A, 3B, 3C, 3D, 3E, 3F, 3G 3H, and 3I show schematic sectional views illustrating different stages of a semiconductor device manufacturing method in accordance with one or more embodiments of this inventive concept. This semiconductor device manufacturing method will be described in details with reference to these drawings.

Figure 3A:
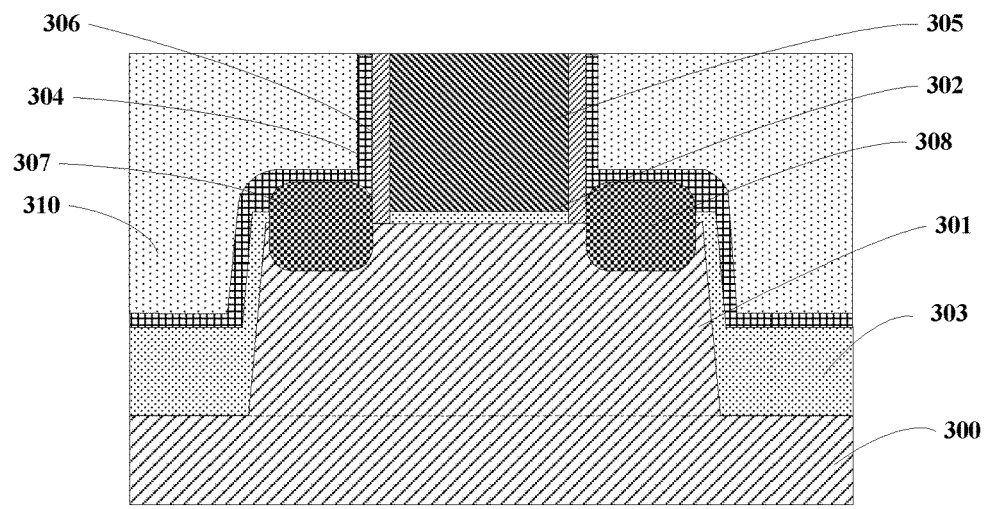
FIGS. 3A, 3B, 3C, 3D, 3E, 3F, 3G 3H, and 3I show schematic sectional views illustrating different stages of a semiconductor device manufacturing method in accordance with one or more embodiments of the inventive concept.
Figure 3B:
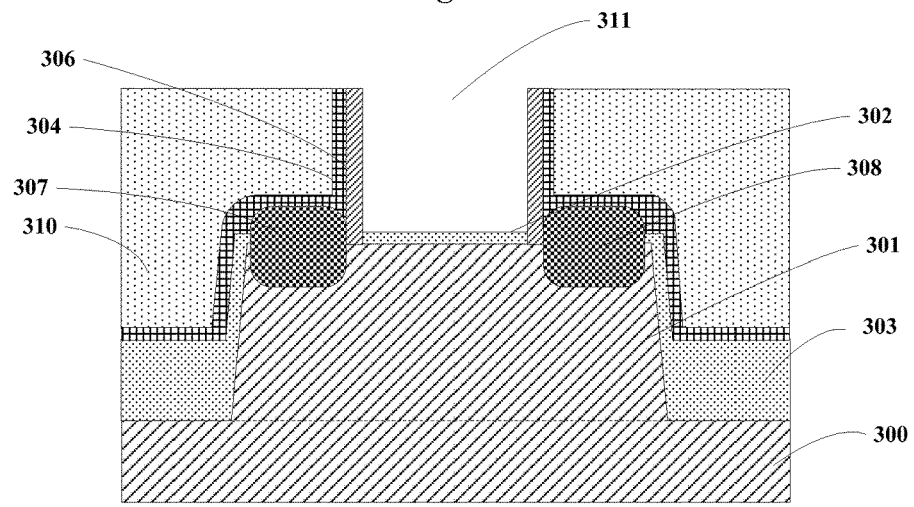

FIGS. 3A and 3B show schematic sectional views illustrating two stages of this semiconducting manufacturing method corresponding to step S202.

Referring to FIG. 3A, an initial structure is first provided. This initial structure may comprise a substrate 300 (e.g., a silicon substrate) and at least one source region 301 (e.g., a semiconductor fin) on the substrate 300. The initial structure may further comprise a pseudo gate structure on the source region 301. The pseudo gate structure may comprise a pseudo gate insulation layer 302 (e.g., a silicon dioxide layer) on the source region 301, and a pseudo gate electrode 305 (e.g., polycrystalline silicon) on the pseudo gate insulation layer 302. The initial structure may further comprise an interlayer dielectric layer 310 (e.g., a silicon dioxide layer) around the pseudo gate structure. The upper surface of the interlayer dielectric layer 310 is on substantially the same horizontal level as the upper surface of the pseudo gate electrode 305.

In the above description, "substantially the same" means that the horizontal difference between the upper surface of the interlayer dielectric layer 310 and the upper surface of the pseudo gate electrode 305 is within an acceptable range, which may be, for example, less than 3 nm. The upper surface of the interlayer dielectric layer 310 and the upper surface of the pseudo gate electrode 305 may be made at "substantially the same" horizontal level by a same planarization process. This inventive concept is not limited herein though. Additionally, the dash lines in the drawings serve for an illustrative purpose to distinguish different regions only, and do not represent any structural components in the devices.

Referring to FIG. 3A, optionally, the initial structure may further comprise a source electrode 307 and a drain electrode 308 in the source region 301 and each at a side of the pseudo gate structure. The initial structure may further comprise a spacer 306 on the source region 301 and located between the source electrode 307 and the pseudo gate electrode 305, and between the drain electrode 308 and the pseudo gate electrode 305. For example, the spacer 306 may comprise silicon dioxide or silicon nitride. In one embodiment, a groove may be formed around the source region 301, and, optionally, the initial structure may further comprise a third insulation layer 303 (e.g., a silicon dioxide layer) at least partially filling the groove, a fourth insulation layer 304 (e.g., a silicon nitride layer) covering the third insulation layer 303, the source electrode 307, and the drain electrode 308, wherein the interlayer dielectric layer 310 is formed on fourth insulation layer 304.

Next, referring to FIG. 3B, the pseudo gate electrode 305 is removed to form a cavity 311, and a semiconductor structure corresponding to step S202 is formed. This semiconductor structure comprises a substrate 300 and at least one source region 301 on the substrate 300. This semiconductor structure may further comprise an interlayer dielectric layer 310 partially covering the source region 301, wherein the interlayer dielectric layer 310 has a cavity 311 on the source region 301. This semiconductor structure may further comprise a pseudo gate insulation layer 302 at the bottom of the cavity 311 covering a portion the source region 301.

Referring to FIG. 3B, optionally, this semiconductor structure may further comprise a source electrode 307 and a drain electrode 308 in the source region 301 and each at a side of the cavity 311. This semiconductor structure may further comprise a spacer 306 on a sidewall of the cavity 311. In one embodiment, a groove may be formed around the source region 301, and, optionally, this semiconductor structure may further comprise a third insulation layer 303 at least partially filling the groove, a fourth insulation layer 304 covering the third insulation layer 303, the source electrode 307, and the drain electrode 308, wherein the interlayer dielectric layer 310 is formed on the fourth insulation layer 304.

Figure 3C:
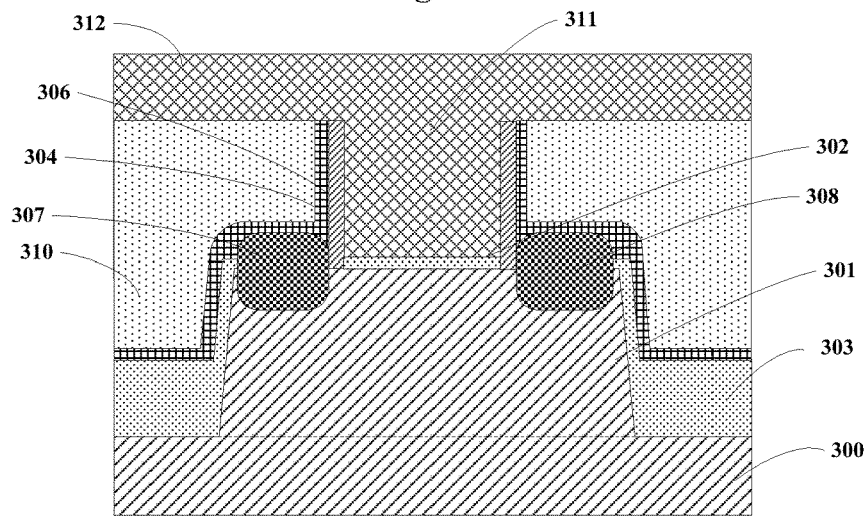
Figure 3D:
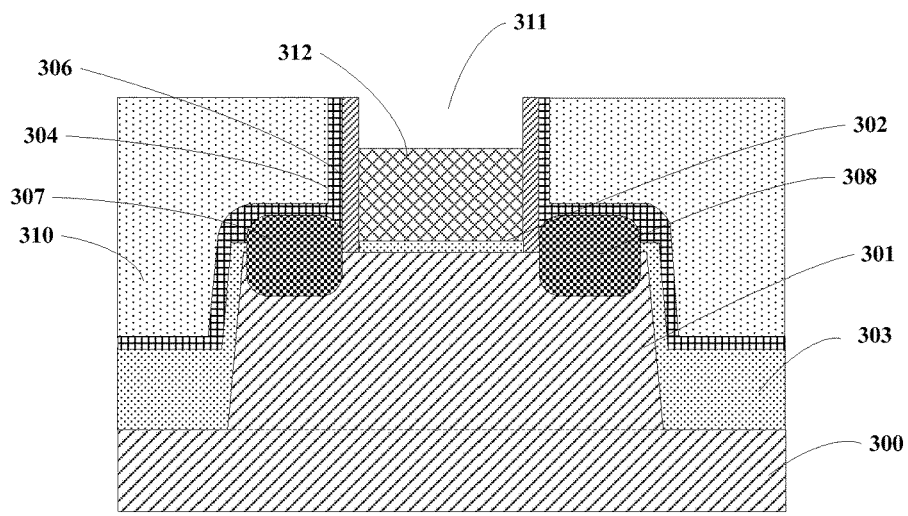

Next, a barrier layer is formed in the cavity. Referring to FIG. 3C, in one embodiment, the process to form the barrier layer comprises: forming a barrier layer 312 filling the cavity 311 on the semiconductor structure through deposition or coating. Referring to FIG. 3D, optionally, the process to form the barrier layer may further comprise removing a portion of the barrier layer 312 so that the remaining barrier layer 312 partially fills the cavity 311, and the upper surface of the interlayer dielectric layer 310 is exposed.

Figure 3E:
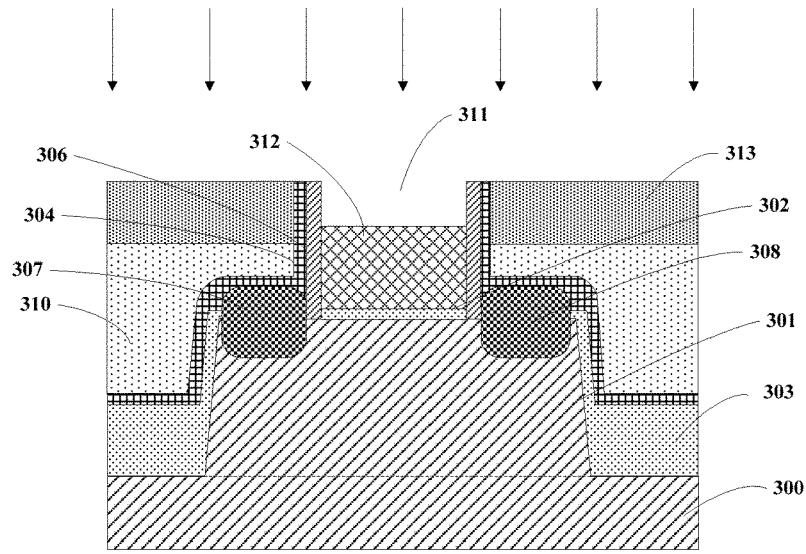

Next, referring to FIG. 3E, a loss reduction region 313 is formed in the interlayer dielectric layer 310 by conducting an ion implantation process comprising silicon ion or carbon ion on the semiconductor structure. For example, the ion used in the ion implantation process may comprise silicon ion, carbon ion, or an ionic group comprising silicon or carbon. In one embodiment, the energy for the ion implantation process is in a range of 1 KeV to 10 KeV (e.g., 5 KeV). The implantation dose may be in a range of $1\times10^{12}$ atom/cm$^2$ to $1\times10^{16}$ atom/cm$^2$.

Silicon or carbon implanted into the interlayer dielectric layer 310 can reduce the loss of the interlayer dielectric layer 310 in succeeding etching or planarization processes, and thus reduces the height loss of the gate electrode. Additionally, the barrier layer 312 formed on the source region 301 can prevent silicon ion, carbon ion, or an ionic group comprising silicon or carbon from being implanted into the source region 301 in the ion implantation process.

In some embodiments, the ion implantation process may also implant the ions into the spacer 106 and/or the fourth insulation layer 304, thus form a loss reduction region in those regions as well. However, since the spacer 106 and the fourth insulation layer 304 are thinner than the interlayer dielectric layer 310, the loss reduction region formed in these regions has a less loss reduction effect than that formed in the interlayer dielectric layer 310. Therefore, the loss reduction region in the spacer 106 and the fourth insulation layer 304 is not shown in the drawing. However, a person of ordinary skill in the art in this field would understand that, in some embodiments, a loss reduction region may also be formed in the spacer 106 and/or the fourth insulation layer 304.

Figure 3F:
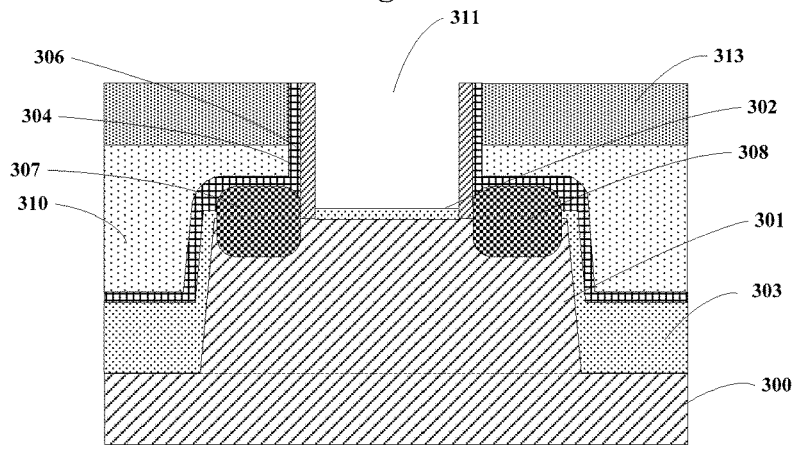

Next, referring to FIG. 3F, the barrier layer 312 is removed. For example, the barrier layer 312 may be removed by an etching process that has a high etch selectivity ratio to silicon oxide or silicon nitride, such as Reactive Ion Etching (RIE) or wet etching.

Figure 3G:
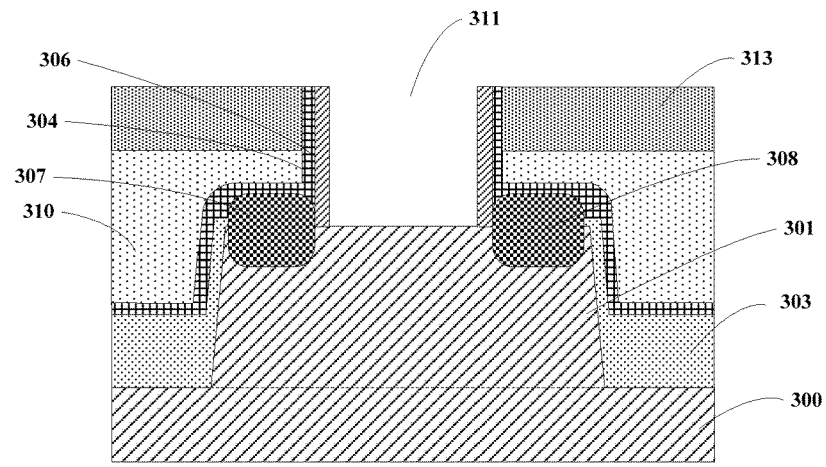

Next, referring to FIG. 3G, the pseudo gate insulation layer 302 is removed by an etching process to expose a portion of the source region 301.

Figure 3H:
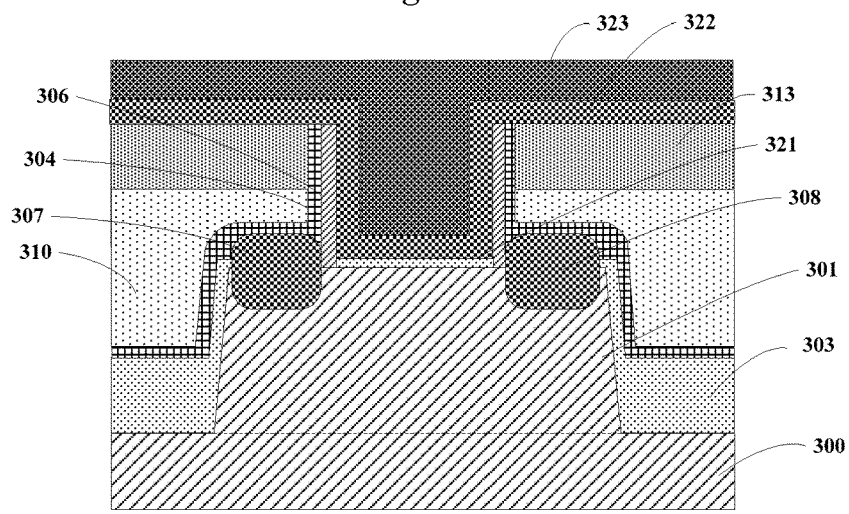
Figure 3I:
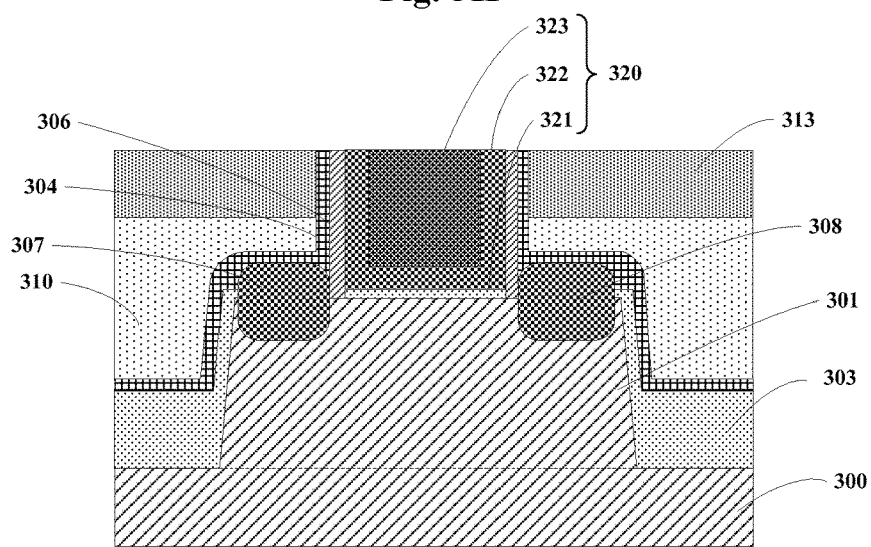

Next, a gate structure is formed on the exposed portion of the source region 301. Referring to FIG. 3H, in one embodiment, the process to form the gate structure may comprise: forming a gate insulation layer 321 (e.g., a silicon dioxide layer) on the exposed portion of the source region 301 through a deposition or an oxidation process; forming a high-K dielectric layer 322 on the gate insulation layer 321 covering the semiconductor structure; and forming a gate material layer 323 on the high-K dielectric layer 322. Referring to FIG. 3I, optionally, the process to form the gate structure may further comprise: forming a gate structure 320 by conducting a planarization process on the semiconductor structure after the gate material layer 323 is formed.

This concludes the description of a semiconductor device manufacturing method in accordance with one or more embodiments of this inventive concept. In this manufacturing method, a loss reduction region is formed in the interlayer dielectric layer by conducting an ion implantation process comprising silicon ion or carbon ion. The loss reduction region can reduce the loss of the interlayer dielectric layer in the succeeding etching or planarization processes, and thus reduce the height loss of the gate electrode. Hence this manufacturing method provides more manufacture margin than conventional methods and helps to improve production yield.

Based on the manufacturing method described above, this inventive concept also presents a semiconductor device. Referring to FIG. 3I, this semiconductor device comprises a substrate 300 and at least one source region 301 on the substrate 300. This semiconductor device may further comprise a gate structure 320 on the source region 301, and an interlayer dielectric layer 310 around the gate structure 320. The interlayer dielectric layer 310 has a loss reduction region 313 that is formed by ion implanting silicon or carbon ions into the interlayer dielectric layer 310. That is, the loss reduction region 313 comprise silicon or carbon.

Referring to FIG. 3I, in one embodiment, the gate structure 320 comprises: a gate insulation layer 321 on the source region 301, a high-K dielectric layer 322 on the gate insulation layer 321, and a gate electrode 323 on the high-K dielectric layer 322.

Referring to FIG. 3I, in one embodiment, the upper surface of the interlayer dielectric layer 310 is on substantially the same horizontal level as the upper surface of the gate electrode 323.

Referring to FIG. 3I, in one embodiment, the semiconductor device may further comprise: a source electrode 307 and a drain electrode 308 in the source region 301 and each at a side of the gate electrode 323. In one embodiment, the semiconductor device may further comprise a spacer 306 on the source region 301 and located between the gate electrode 323 and the source electrode 307, and between the gate electrode 323 and the drain electrode 308.

Referring to FIG. 3I, in one embodiment, a groove is formed around the source region 301. And the semiconductor device may further comprise a third insulation layer 303 at least partially filling the groove. In one embodiment, the semiconductor device may further comprise a fourth insulation layer 304 covering the third insulation layer 303, the source electrode 307, and the drain electrode 308, and the interlayer dielectric layer 310 is on the fourth dielectric layer 304.

In the embodiment of this inventive concept, the source region 301 may be a semiconductor fin or a source region of a planar device.

FIGS. 4A, 4B, 4C, 4D, 4E, 4F, 4G and 4H show schematic sectional views illustrating different stages of a semiconductor device manufacturing method in accordance with one or more embodiments of this inventive concept. This semiconductor device manufacturing method will be described in details with reference to these drawings.

Figure 4A:
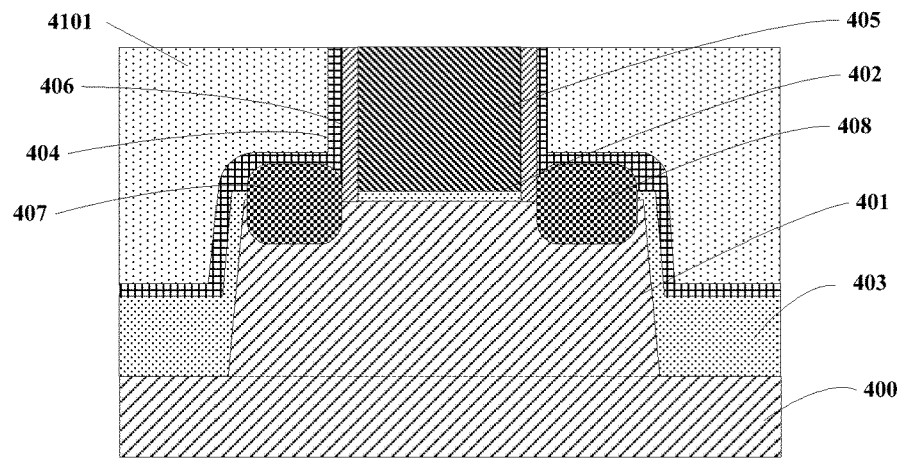
FIGS. 4A, 4B, 4C, 4D, 4E, 4F, 4G and 4H show schematic sectional views illustrating different stages of a semiconductor device manufacturing method in accordance with one or more embodiments of this inventive concept.

Referring to FIG. 4A, an initial structure is first provided. This initial structure may comprise a substrate 400 and at least one source region 401 on the substrate 400. The initial structure may further comprise a pseudo gate structure on the source region 401. The pseudo gate structure may comprise a pseudo gate insulation layer 402 on the source region 401, and a pseudo gate electrode 405 on the pseudo gate insulation layer 402. The initial structure may further comprise a first insulation layer 4101 (e.g., a silicon dioxide layer) around the pseudo gate structure. The upper surface of the first insulation layer 4101 is on substantially the same horizontal level as the upper surface of the pseudo gate electrode 405.

In some embodiments, the initial structure may further comprise a source electrode 407, a drain electrode 408, a spacer 406, a third insulation layer 403, and a fourth insulation layer 404. These structures or components are the same as or similar to, respectively, the source electrode 307, the drain electrode 308, the spacer 306, the third insulation layer 303, and the fourth insulation layer 304 shown in FIG. 3A, thus are not repeatedly described here.

Figure 4B:
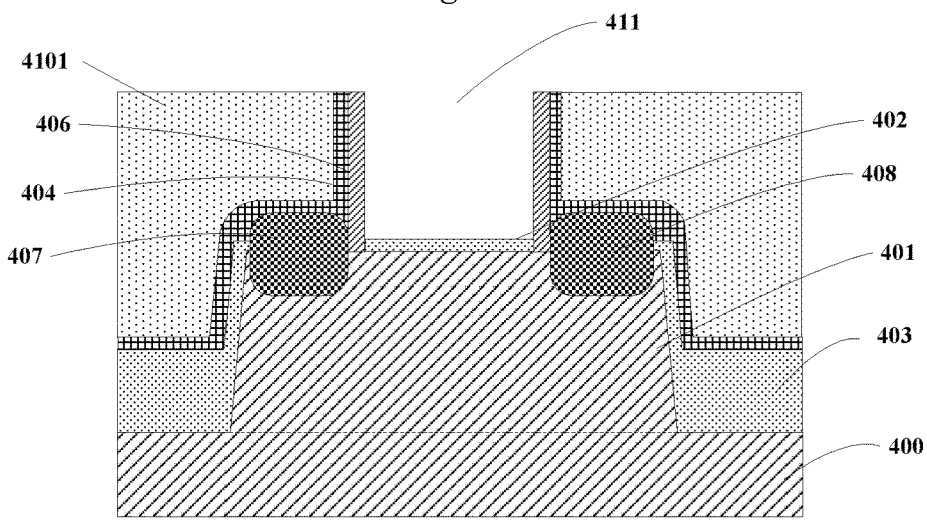

Next, referring to FIG. 4B, the pseudo gate electrode 405 is removed to form a cavity 411.

Figure 4C:
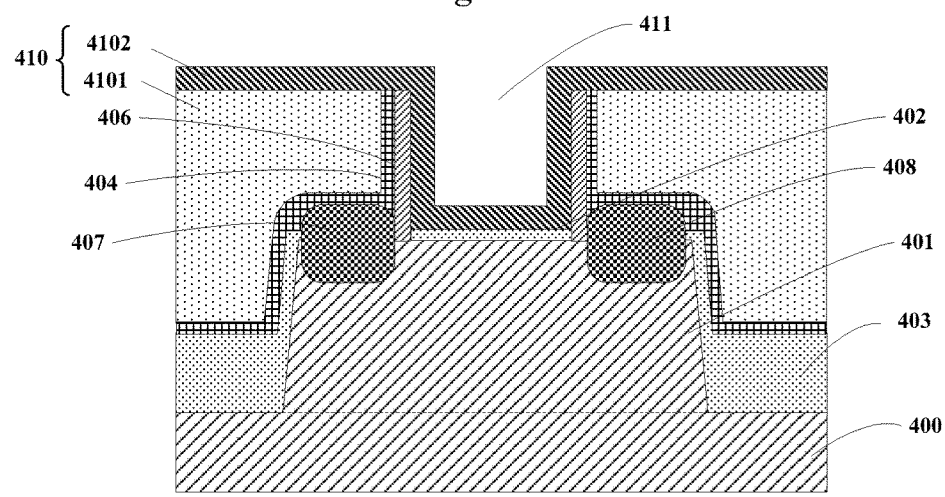

Next, referring to FIG. 4C, a second insulation layer 4102 is formed by a deposition method (e.g., Atomic Layer Deposition (ALD)) on the first insulation layer 4101 and on the bottom and the sidewall of the cavity 411. The second insulation layer 4102 may comprise silicon dioxide or silicon nitride. In one embodiment, a portion of the first insulation layer 4101 and a portion of the second insulation layer 4102 may together form an interlayer dielectric layer 410. That is, the interlayer dielectric layer 410 comprises a portion of the first insulation layer 4101 covering the source region 401 and a portion of the second insulation layer 4102 on that portion of the first insulation layer 4101.

This concludes the description of the semiconductor structure shown in FIG. 4C. This semiconductor structure is similar to the semiconductor structure shown in FIG. 3B. The difference between these two semiconductor structures is that the interlayer dielectric layer shown in FIG. 3B has a single layer structure while the interlayer dielectric layer shown in FIG. 4C has a multi-layer structure (e.g., two-layer structure).

Figure 4D:
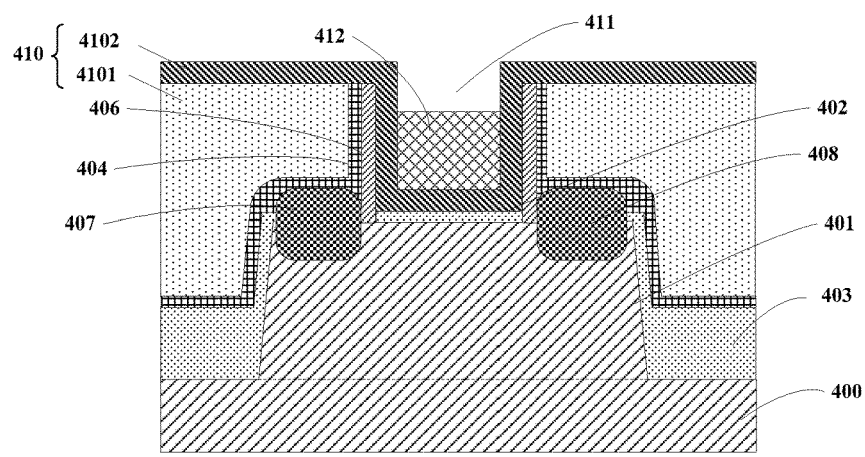

Next, referring to FIG. 4D, a barrier layer 412 is formed in the cavity 411. The barrier layer 412 is formed on the second insulation layer 4102.

Figure 4E:
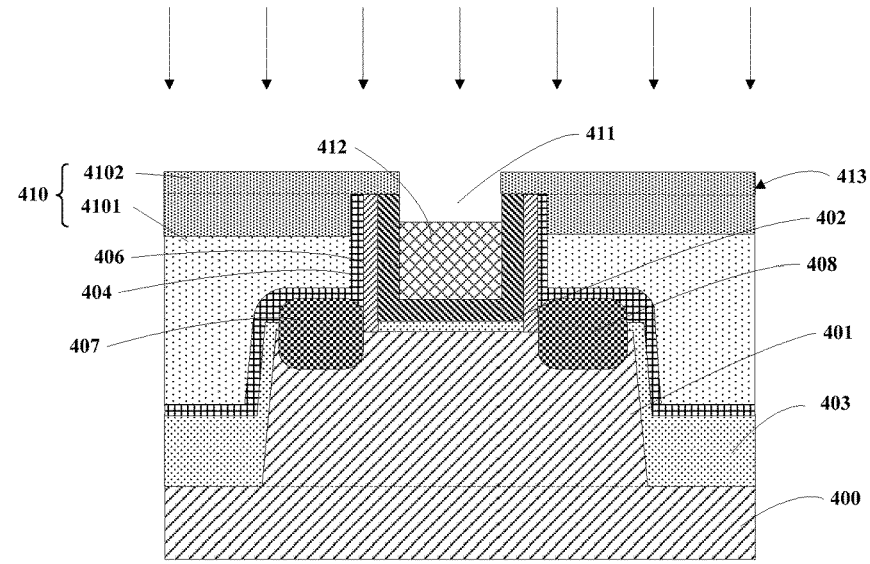

Next, referring to FIG. 4E, a loss reduction region 413 is formed in the interlayer dielectric layer 410 by conducting an ion implantation process comprising silicon ion or carbon ion on the semiconductor structure. In one embodiment, the loss reduction region 413 is formed in the second insulation layer 4102. In another embodiment, the loss reduction region 413 may also be formed in the first insulation layer 4101.

Figure 4F:
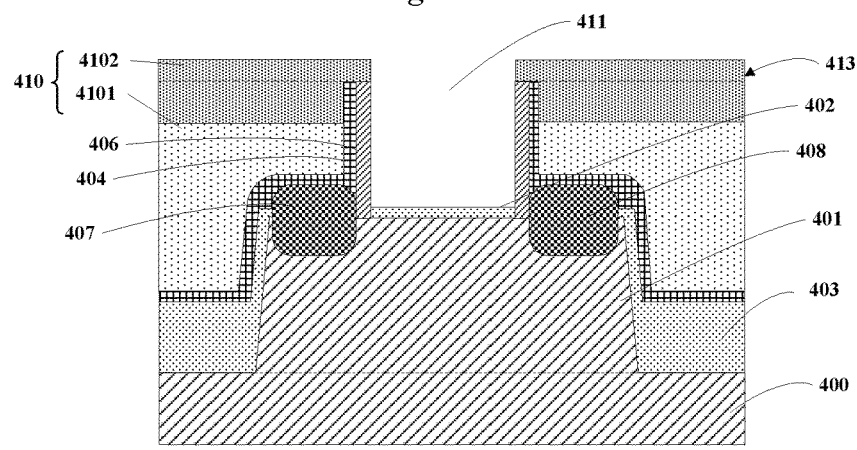

Next, referring to FIG. 4F, the barrier layer 412 is removed. After the barrier layer 412 is removed, the second insulation layer 4102 in the cavity 411 is also removed.

In one embodiment, the manufacturing method may further comprise conducting a thermal annealing process on the semiconductor structure after the barrier layer 412 is removed but before the second insulation layer 4102 in the cavity 411 is removed. The temperature for the thermal annealing process may be in a range of 500° C. to 1200° C.

(e.g., 800° C.). The thermal annealing process can repair the damage in the semiconductor structure made in the ion implantation process.

Figure 4G:
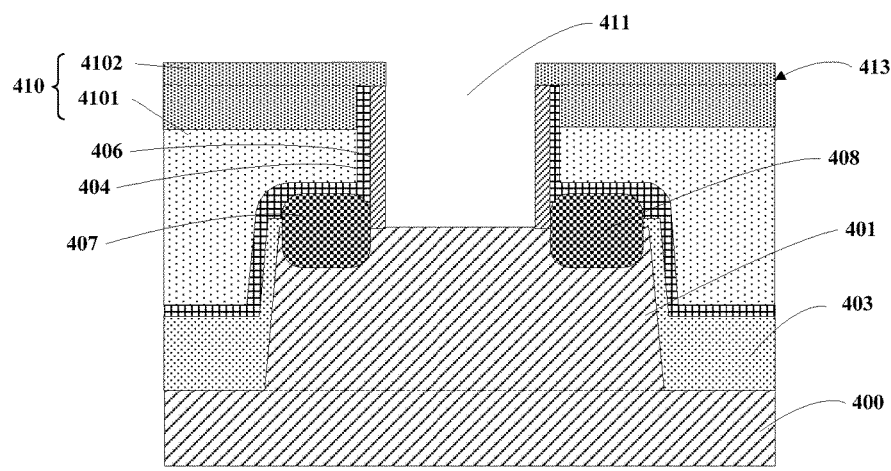

Next, referring to FIG. 4G, the pseudo gate insulation layer 402 is removed to expose a portion of the source region 401.

Figure 4H:
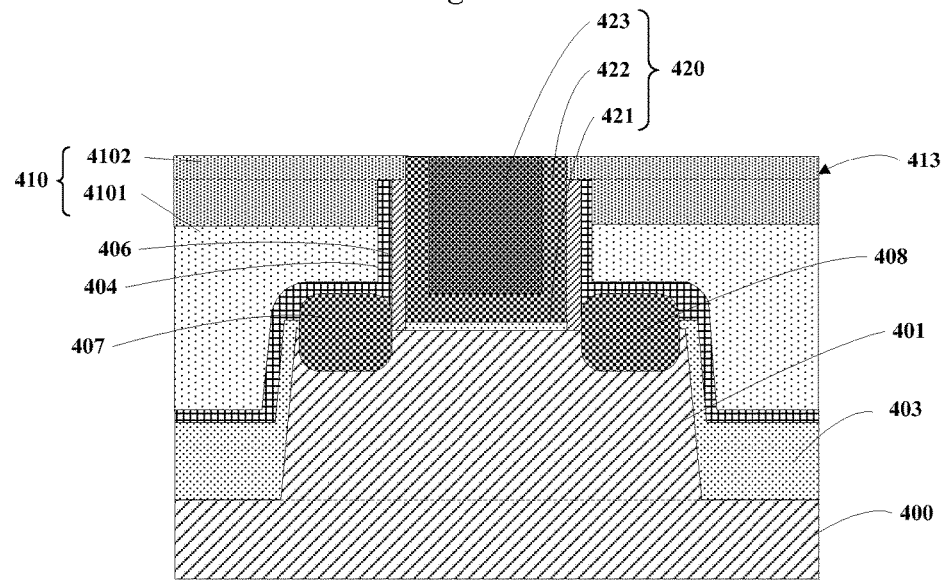

Next, referring to FIG. 4H, a gate structure 420 is formed on the exposed portion of the source region 401. The gate structure 420 may comprise a gate insulation layer 421 on the source region 401, a high-K dielectric layer 422 on the gate insulation layer 421, and a gate electrode 423 on the high-K dielectric layer 422.

This concludes the description of a semiconductor device manufacturing method in accordance with one or more embodiments of this inventive concept. In this manufacturing method, a second insulation layer is formed on the first insulation layer, which increases the thickness of the interlayer dielectric layer and further reduces the loss of interlayer dielectric layer. Therefore the height decrease of the gate electrode can be further avoided in succeeding processes. This manufacturing method provides more manufacturing margin than conventional methods and helps to improve production yield.

In some embodiments, the process to form the second insulation layer may be repeated multiple times. For example, referring to FIG. 4F, after the barrier layer 412 and second insulation layer 4102 in the cavity 411 have been removed, a new second insulation layer may be formed on the semiconductor structure of FIG. 4F, a new barrier layer may be formed on the new second insulation layer, and an ion implantation process may be conducted on the semiconductor structure again. After that, the new barrier layer and the new second insulation layer in the cavity will be removed again and this process may be repeated multiple times until the thickness of the second insulation layer meets a predefined criterion. This repeated process may form a thick second insulation layer that can further reduce the loss of the interlayer dielectric layer. In some embodiment, this repeated process can also increase the thickness of the interlayer dielectric layer.

Based on the manufacturing method described above, this inventive concept further presents a semiconductor device, as shown in FIG. 4H. Most of the structures in the semiconductor device shown in FIG. 4H are the same as or similar to their counterparts in the semiconductor device shown in FIG. 3I, therefore are not repeatedly described here. The difference between these two semiconductor devices is that the interlayer dielectric layer shown in FIG. 3I has a single layer structure while the interlayer dielectric layer shown in FIG. 4H has a multi-layer structure (e.g., a two-layer structure). Referring to FIG. 4H, in one embodiment, the interlayer dielectric layer 410 may comprise a portion of the first insulation layer 4101 on the source region 401, and a portion of the second insulation layer 4102 on that portion of the first insulation layer 4101. The first insulation layer 4101 may comprise silicon dioxide, and the second insulation layer 4102 may comprise silicon dioxide or silicon nitride.

FIGS. 5A, 5B, 5C, 5D, 5E, 5F, 5G1, 5G2, 5H, and 5I show schematic sectional views illustrating different stages of a semiconductor device manufacturing method in accordance with one or more embodiments of this inventive concept. This semiconductor device manufacturing method will be described in details with reference to these drawings.

Figure 5A:
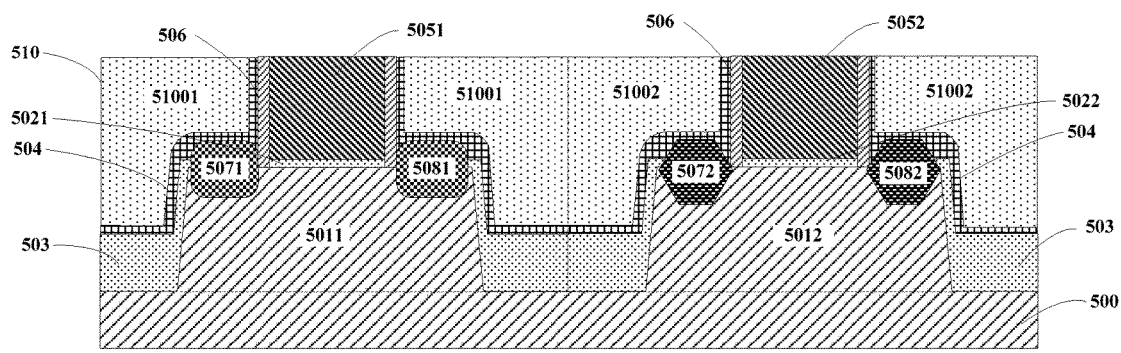

Referring to FIG. 5A, an initial structure is first provided. The initial structure may comprise a substrate 500 and at least one source region on the substrate 500. For example, the source region may comprise a first source region 5011 for a first device and a second source region 5012 for a second device. In one embodiment, the first device may be an N-type Metal Oxide Semiconductor (NMOS) transistor, and the second device may be a P-type Metal Oxide Semiconductor (PMOS) transistor. In another embodiment, the first device may be a core device while the second device is an Input/Output (I/O) device.

Referring to FIG. 5A, the initial structure may further comprise a pseudo gate structure on the source region. For example, the pseudo gate structure may comprise a first pseudo gate structure on the first source region 5011, and a second pseudo gate structure on the second source region 5012. The first pseudo gate structure may comprise a first pseudo gate insulation layer 5021 on the first source region 5011, and a first pseudo gate electrode 5051 on the first pseudo gate insulation layer 5021. The second pseudo gate structure may comprise a second pseudo gate insulation layer 5022 on the second source region 5012, and a second pseudo gate electrode 5052 on the second pseudo gate insulation layer 5022.

Referring to FIG. 5A, the initial structure may further comprise an interlayer dielectric layer 510 around the pseudo gate structure. The interlayer dielectric layer 510 may comprise a first part of the interlayer dielectric layer 51001 covering a portion of the first source region 5011, and a second part of the interlayer dielectric layer 51002 covering a portion of the second source region 5012. The upper surface of the interlayer dielectric layer 510 is on substantially the same horizontal level as the upper surface of the pseudo gate structure.

Additionally, the initial structure may further comprise a first source electrode 5071 and a first drain electrode 5081 both on the first source region 5011, a second source electrode 5072 and a second drain electrode 5082 both on the second source region 5012, a spacer 506, a third insulation layer 503, and a fourth insulation layer 504. These structures or components are the same as or similar to, respectively, the source electrode 307, the drain electrode 308, the spacer 306, the third insulation layer 303, and the fourth insulation layer 304 shown in FIG. 4A. Hence, in the interest of avoiding redundancy, these structures are not described in detail.

Figure 5B:
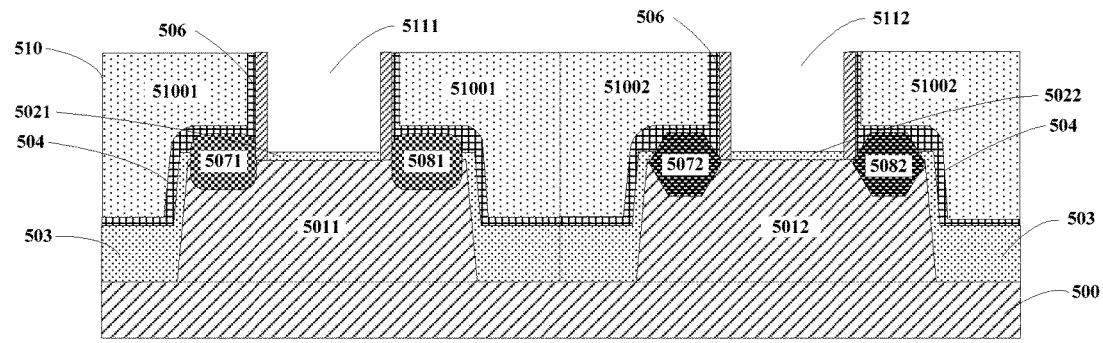

Next, referring to FIG. 5B, the first pseudo gate electrode 5051 and the second pseudo gate electrode 5052 are removed to form a first cavity 5111 and a second cavity 5112, respectively. And a semiconductor structure shown in FIG. 5B is formed.

Figure 5C:
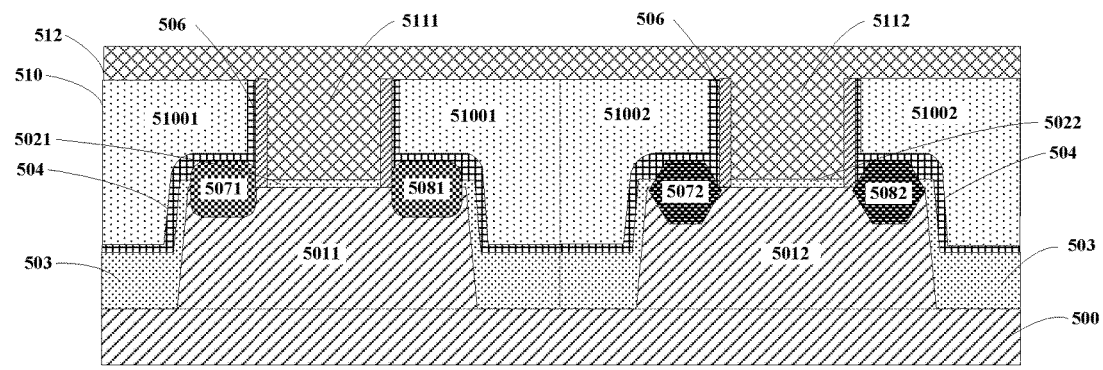

Next, referring to FIG. 5C, a barrier layer 512 filling the first cavity 5111 and the second cavity 5112 is formed on the semiconductor structure of FIG. 5B through deposition or coating. As shown in FIG. 5C, the barrier layer 512 may, in addition to filling the first cavity 5111 and the second cavity 5112, form a layer on top of the first part of the interlayer dielectric layer 51001 and the second part of the interlayer dielectric layer 51002.

Figure 5D:
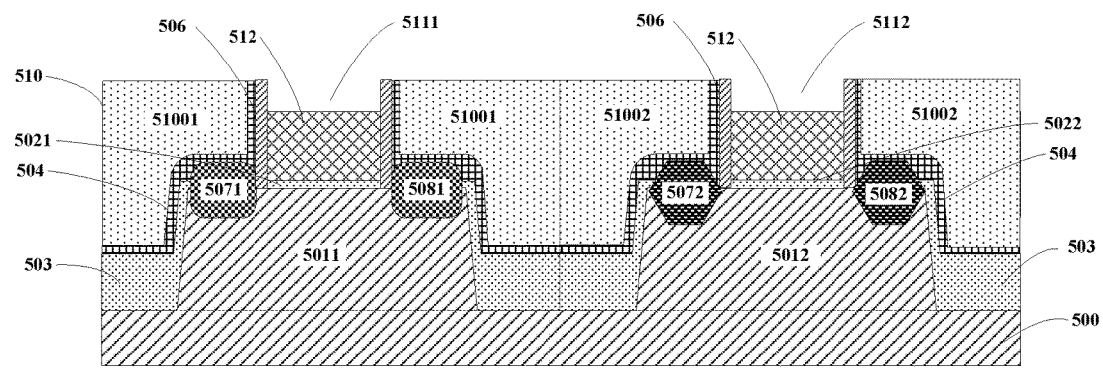

Next, referring to FIG. 5D, a portion of the barrier layer 512 is removed while the remaining barrier layer 512 partially filling the first cavity 5111 and the second cavity 5112. This process exposes the upper surface of the interlayer dielectric layer 510. The portion of the barrier layer 512 that was on the first part of the interlayer dielectric layer 51001 and the second part of the interlayer dielectric layer 51002 is removed during this process.

Next, referring to FIG. 5E, a loss reduction region 513 is formed in the interlayer dielectric layer 510 by conducting an ion implantation process comprising silicon ion or carbon ion on the semiconductor structure of FIG. 5D.

Next, referring to FIG. 5F, the barrier layer 512 is removed.

Next, the pseudo gate insulation layer is removed. The pseudo gate insulation layer may be removed by two different processes, which will be described with reference to FIGS. 5G1, 5G2, and 5H.

Figure 5H:
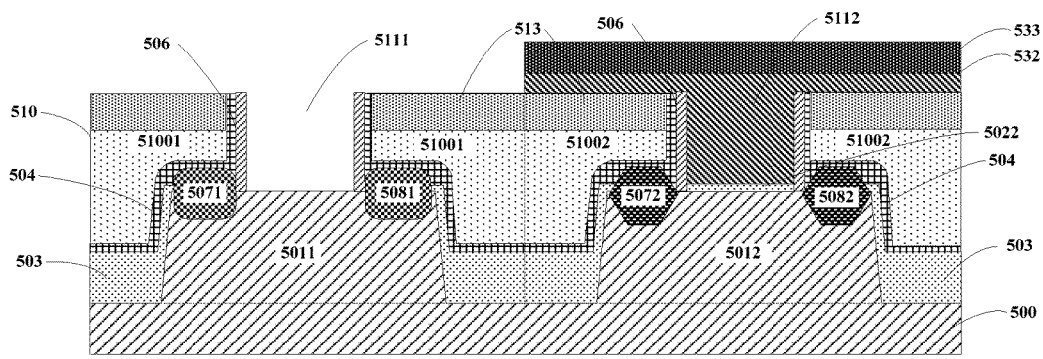
Figure 5H:
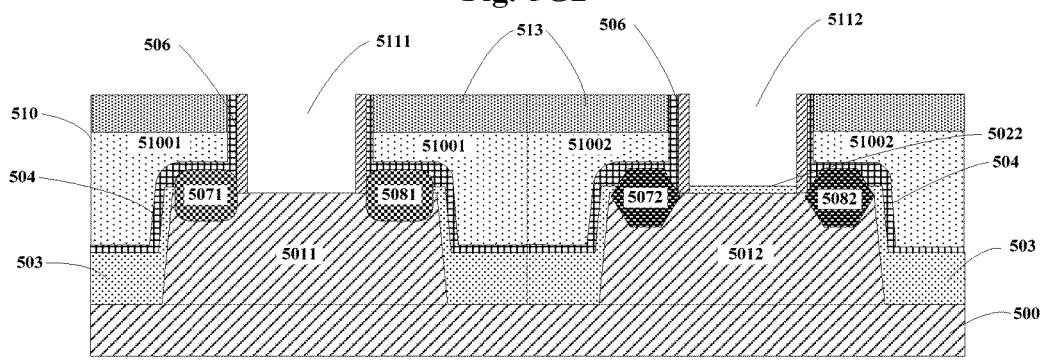

Referring to FIG. 5G1, in one embodiment, the first process that can be used to remove the pseudo gate insulation layer comprises: forming a hard mask layer 531 (e.g., photoresist) on the second part of the interlayer dielectric layer 51002 and in the second cavity 5112; removing the pseudo gate insulation layer in the first cavity 5111 (the first pseudo gate insulation layer 5021) to expose a portion of the first source region 5011; and, referring to FIG. 5H, removing the hard mask layer 531. In one embodiment, the first process may further comprise: conducting a thermal annealing process on the semiconductor structure with the loss reduction region after the barrier layer 512 is removed but before the hard mask layer 531 is formed.

Referring to FIG. 5G2, in another embodiment, the second process that can be used to remove the pseudo gate insulation layer comprises: forming a cover layer 532 (e.g., a BARC layer) on the second part of the interlayer dielectric layer 51002 and in the second cavity 5112; forming a hard mask layer 533 (e.g., photoresist) on the cover layer 532; removing the pseudo gate insulation layer in the first cavity 5111 (the first pseudo gate insulation layer 5021) to expose a portion of the first source region 5011; and, referring to FIG. 5H, removing the hard mask layer 533 and the cover layer 532. In one embodiment, the second process may further comprise: conducting a thermal annealing process on the semiconductor structure with the loss reduction region after the barrier layer 512 is removed but before the cover layer 532 is formed.

In the above-described embodiments, the pseudo gate insulation layer in the first cavity 5111 is removed, and the pseudo gate insulation layer in the second cavity 5112 is retained. In some other embodiments, the pseudo gate insulation layer in the second cavity 5112 may also be removed.

Figure 5I:
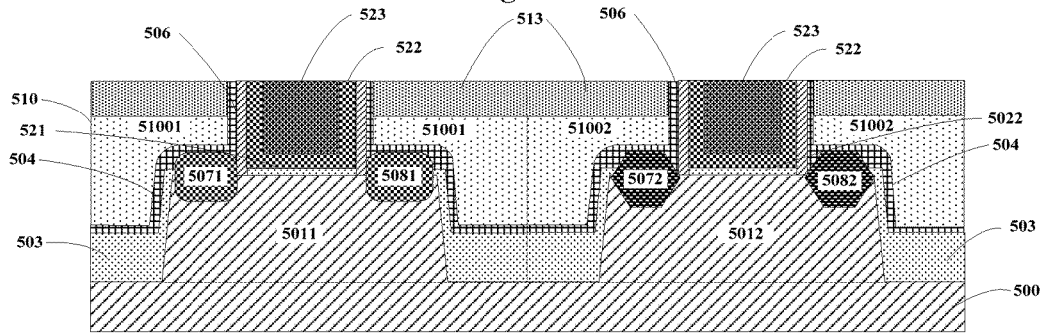

Next, referring to FIG. 5I, after the pseudo gate insulation layer in the first cavity 5111 is removed, a gate insulation layer 521 is formed at least on the exposed portion of the first source region 5011, then a high-K dielectric layer 522 is formed on the sidewall and the base of the first cavity 5111 and the second cavity 5112, leaving an unfilled portion in each of the first cavity 5111 and the second cavity 5112. A gate electrode 523 is formed in the unfilled portions of the first cavity 5111 and the second cavity 5112, and on the high-K dielectric layer 522. In this embodiment, the high-K dielectric layer 522 is formed on the gate insulation layer 521 in the first cavity 5111, while the high-K dielectric layer 522 is formed on the pseudo gate insulation layer (e.g., the second pseudo gate insulation layer 5022) in the second cavity 5112.

This concludes the description of a semiconductor device manufacturing method in accordance with one or more embodiments of this inventive concept. In this method, the ion implantation process is conducted on at least two devices. After the ion implantation process, the pseudo gate insulation layer on at least one source region is removed, and a gate structure is formed there.

Based on the manufacturing method described above, this inventive concept also presents a semiconductor device. Referring to FIG. 5I, the source region of this semiconductor device comprises the first source region 5011 for a first device and a second source region 5012 for a second device. Other structures or components of this semiconductor device are the same as or similar to their counterparts in FIG. 3I, and will not be described here in the interest of avoiding redundancy.

Figure 6A:
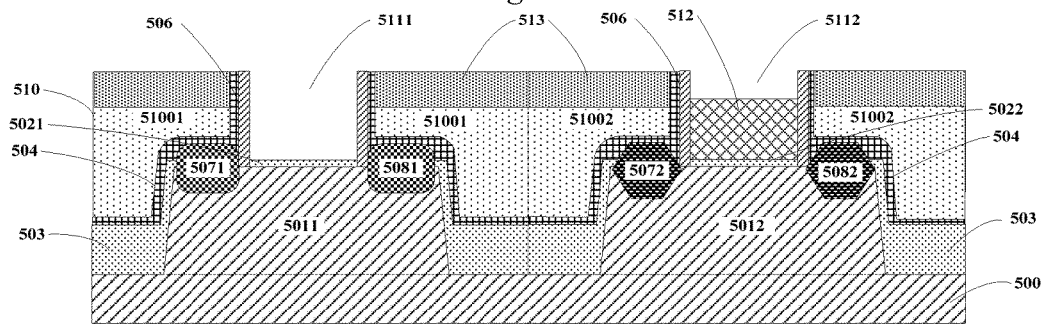
FIGS. 6A, 6B, and 6C show schematic sectional views illustrating different stages of a semiconductor device manufacturing method in accordance with one or more embodiments of this inventive concept.
Figure 6B:
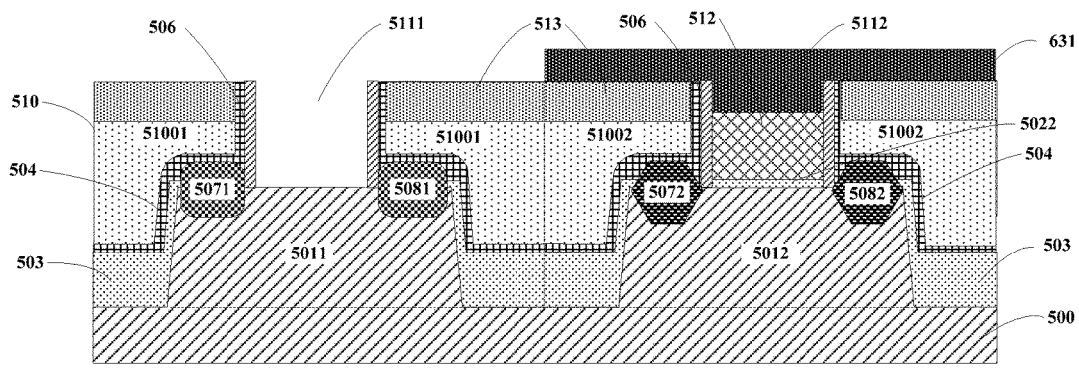
Figure 6C:
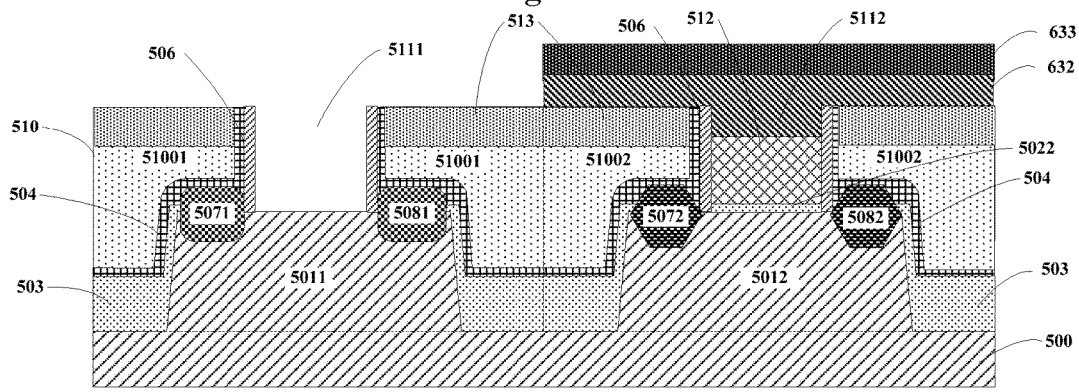

FIGS. 6A, 6B, and 6C show schematic sectional views illustrating different stages of a semiconductor device manufacturing method in accordance with one or more embodiments of this inventive concept. This semiconductor device manufacturing method will be described in details with reference to these drawings.

Referring to FIG. 5E, the barrier layer 512 is removed after the ion implantation process. In some embodiments, the process to remove the barrier layer 512 may comprise, referring to FIG. 6A, removing the barrier layer 512 in the first cavity 5111 while retaining the barrier layer 512 in the second cavity 5112.

Next, the pseudo gate insulation layer is removed. The pseudo gate insulation layer may be removed by two different processes, which will be described with reference to FIGS. 6B, 6C, and 5H.

Referring to FIG. 6B, in one embodiment, the first process that can be used to remove the pseudo gate insulation layer may comprise: forming a hard mask layer 631 (e.g., photoresist) on the second part of the interlayer dielectric layer 51002 and on the barrier layer 512 in the second cavity 5112; removing the pseudo gate insulation layer in the first cavity 5111 (the first pseudo gate insulation layer 5021) to expose a portion of the first source region 5011; and, referring to FIG. 5H, removing the hard mask layer 631 and the barrier layer 512 in the second cavity 5112.

Referring to FIG. 6C, in another embodiment, the second process that can be used to remove the pseudo gate insulation layer may comprise: forming a cover layer 632 (e.g., a BARC layer) on the second part of the interlayer dielectric layer 51002 and on the barrier layer 512 in the second cavity 5112; forming a hard mask layer 633 (e.g., photoresist) on the cover layer 632; removing the pseudo gate insulation layer in the first cavity 5111 (the first pseudo gate insulation layer 5021) to expose a portion of the first source region 5011; and, referring to FIG. 5H, removing the hard mask layer 633, the cover layer 632, and the barrier layer 512 in the second cavity 5112.

Next, referring to FIG. 5I, after the pseudo gate insulation layer in the first cavity 5111 is removed, a gate insulation layer 5211 is formed on at least the exposed portion of the first source region 5011, then a high-K dielectric layer 522 is formed on the sidewall and base of the first cavity 5111 and the second cavity 5112 while maintaining unfilled portions of the cavities 5111 and 5112, and a gate electrode 523 is formed to fill the previously unfilled portions of the cavities 5111, 5112 that are lined with the high-K dielectric layer 522.

This concludes the description of a semiconductor manufacturing method in accordance with one or more embodiments of this inventive concept. In this method, after the ion implantation process, the pseudo gate insulation layer on at least one source region is removed, and a gate structure is formed there.

FIGS. 7A, 7B, 7C, 7D, 7E, 7F, 7G1, 7G2, 7H, and 7I show schematic sectional views illustrating different stages of a semiconductor device manufacturing method in accordance with one or more embodiments of this inventive concept. This semiconductor device manufacturing method will be described in details with reference to these drawings.

Figure 7A:
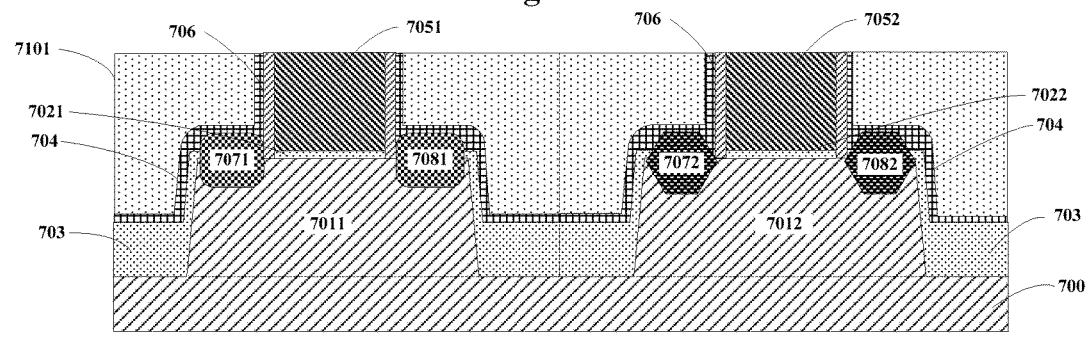

Referring to FIG. 7A, an initial structure is first provided. This initial structure may comprise a substrate 700, a first source region 7011, a second source region 7012, a first pseudo gate insulation layer 7021, a pseudo gate electrode 7051, a second pseudo gate insulation layer 7022, and a second pseudo gate electrode 7052. These structures or components are the same as or similar to, respectively, the substrate 500, the first source region 5011, the second source region 5012, the first pseudo gate insulation layer 5021, the first pseudo gate electrode 5051, the second pseudo gate insulation layer 5052, and the second pseudo gate electrode 5052 of FIG. 5A, thus are not repeatedly described here.

Referring to FIG. 7A, this initial structure may further comprise a first insulation layer 7101 around the pseudo gate structure. The upper surface of the first insulation layer 7101 is at substantially the same horizontal level as the upper surface of the first pseudo gate electrode 7051 and the upper surface of the second pseudo gate electrode 7052.

Additionally, the initial structure may further comprise a first source electrode 7071, a first drain electrode 7081, a second source electrode 7072, a second drain electrode 7082, a spacer 706, a third insulation layer 703, and a fourth insulation layer 704. These structures or components are the same as or similar to, respectively, the first source electrode 5071, the first drain electrode 5081, the second source electrode 5072, the second drain electrode 5082, the spacer 506, the third insulation layer 503, and the fourth insulation layer 504 of FIG. 5A, thus are not repeatedly described here.

Figure 7B:
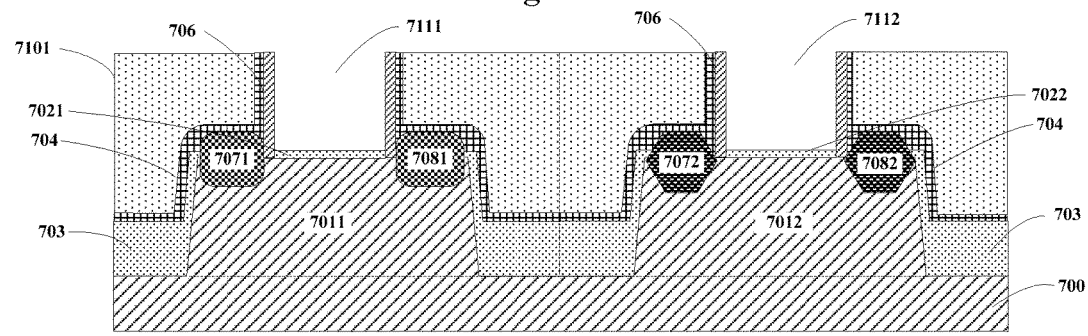

Next, referring to FIG. 7B, the first pseudo gate electrode 7051 and the second pseudo gate electrode 7052 are removed to form a first cavity 7111 and a second cavity 7112, respectively. And a semiconductor structure shown in FIG. 7B is formed.

Figure 7C:
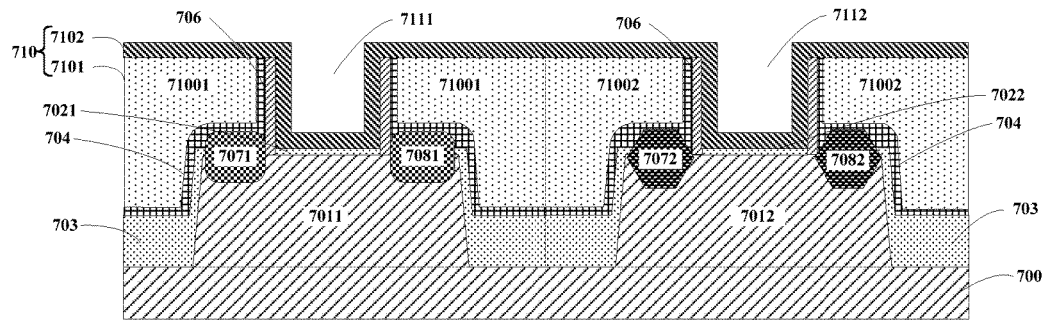

Next, referring to FIG. 7C, a second insulation layer 7102 is deposited on the first insulation layer 7101, on the bottom and a sidewall of the first cavity 7111, and on the bottom and a sidewall of the second cavity 7112. The first insulation layer 7101 and the second insulation layer 7102 together form an interlayer dielectric layer 710. The interlayer dielectric layer 710 may comprise a first part of the interlayer dielectric layer 71001 covering the first source region 7011, and a second part of the interlayer dielectric layer 71002 covering the second source region 7012.

Figure 7D:
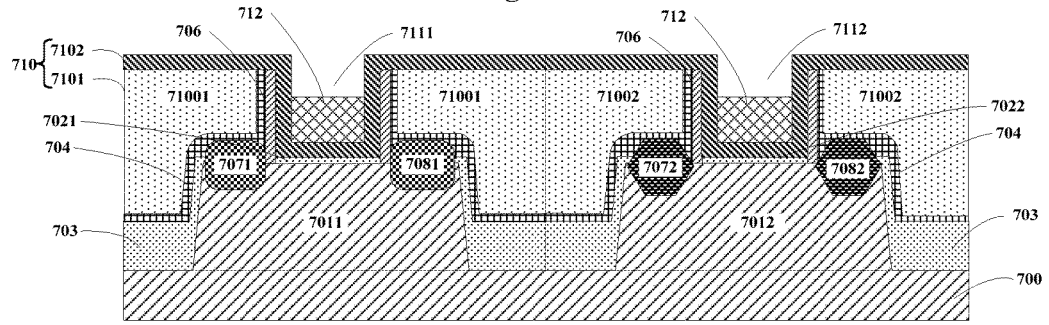

Next, referring to FIG. 7D, a barrier layer 712 is formed in the first cavity 7111 and the second cavity 7112.

Figure 7E:
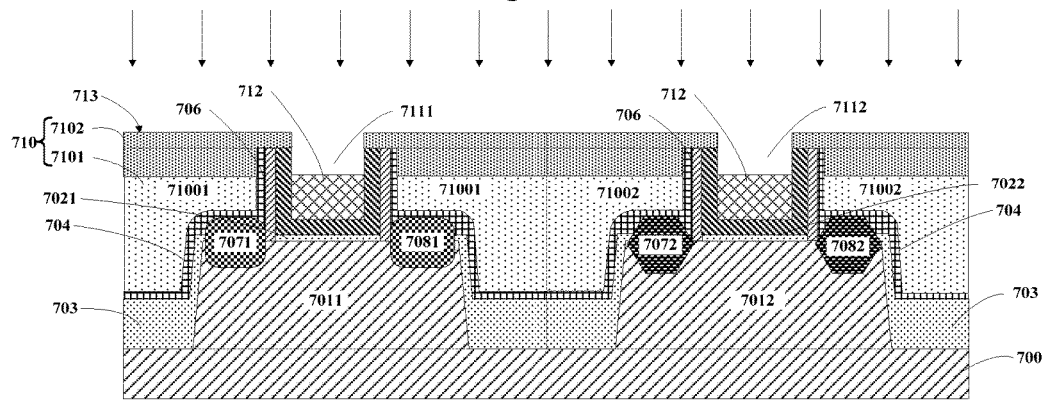

Next, referring to FIG. 7E, a loss reduction region 713 is formed in the interlayer dielectric layer 710 by conducting an ion implantation process comprising silicon ion or carbon ion on the semiconductor structure.

Figure 7F:
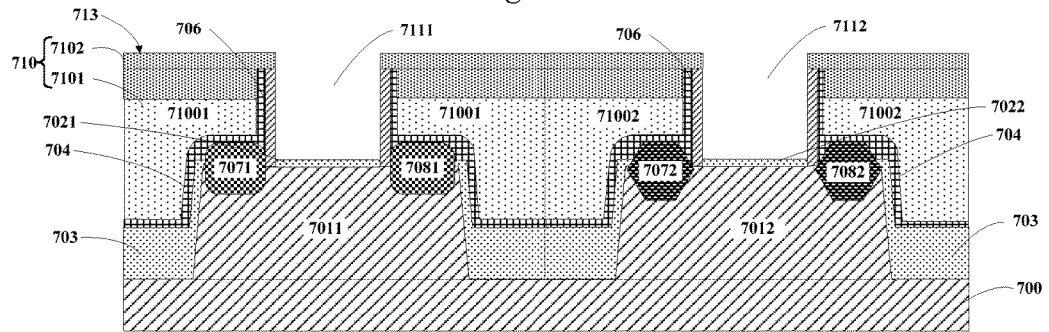

Next, referring to FIG. 7F, the barrier layer 712 is removed.

Next, the pseudo gate insulation layer is removed. The pseudo gate insulation layer may be removed by two different processes, which will be described with reference to FIGS. 7G1, 7G2, and 7H.

Figure 7H:
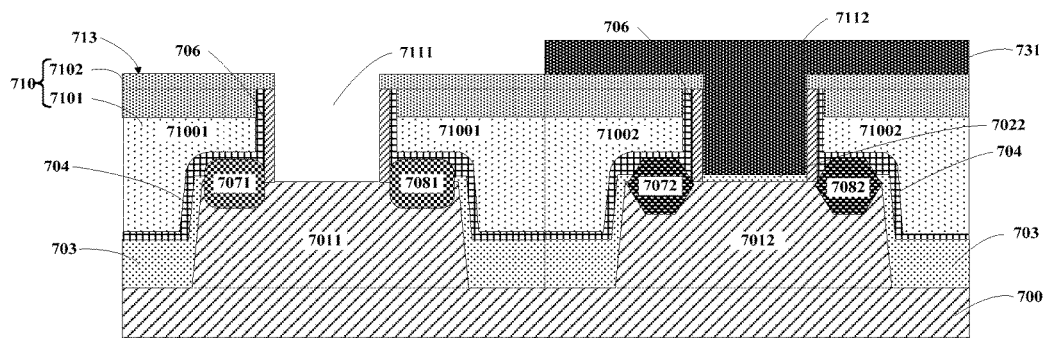
Figure 7H:
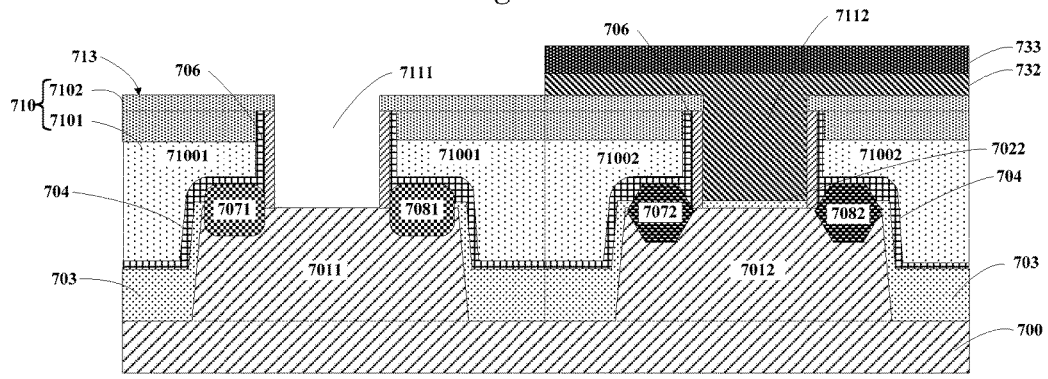
Figure 7H:
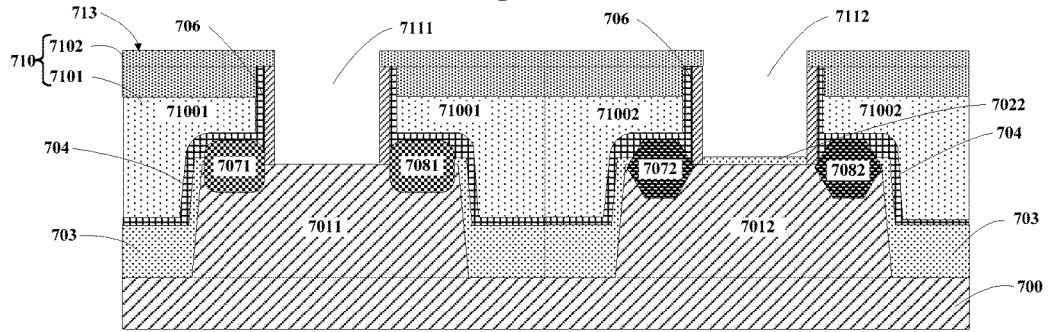

Referring to FIG. 7G1, in one embodiment, the first process that can be used to remove the pseudo gate insulation layer comprises: forming a hard mask layer 731 (e.g., photoresist) on the second part of the interlayer dielectric layer 71002 and in the second cavity 7112; removing the pseudo gate insulation layer in the first cavity 7111 (the first pseudo gate insulation layer 7021) to expose a portion of the first source region 7011; and, referring to FIG. 7H, removing the hard mask layer 731. In one embodiment, the first process may further comprise: conducting a thermal annealing process on the semiconductor structure with the loss reduction region after the barrier layer 712 is removed but before the hard mask layer 731 is formed.

Referring to FIG. 7G2, in another embodiment, the second process that can be used to remove the pseudo gate insulation layer comprises: forming a cover layer 732 (e.g., a BARC layer) on the second part of the interlayer dielectric layer 71002 and in the second cavity 7112; forming a hard mask layer 733 (e.g., photoresist) on the cover layer 732; removing the pseudo gate insulation layer in the first cavity 7111 (the first pseudo gate insulation layer 7021) to expose a portion of the first source region 7011; and, referring to FIG. 7H, removing the hard mask layer 733 and the cover layer 732. In one embodiment, the second process may further comprise: conducting a thermal annealing process on the semiconductor structure with the loss reduction region after the barrier layer 712 is removed but before the cover layer 732 is formed.

In the above-described embodiments, the pseudo gate insulation layer in the first cavity 7111 is removed while the pseudo gate insulation layer in the second cavity 7112 is retained. In some other embodiments, the pseudo gate insulation layer in the second cavity 7112 may also be removed.

Figure 7I:
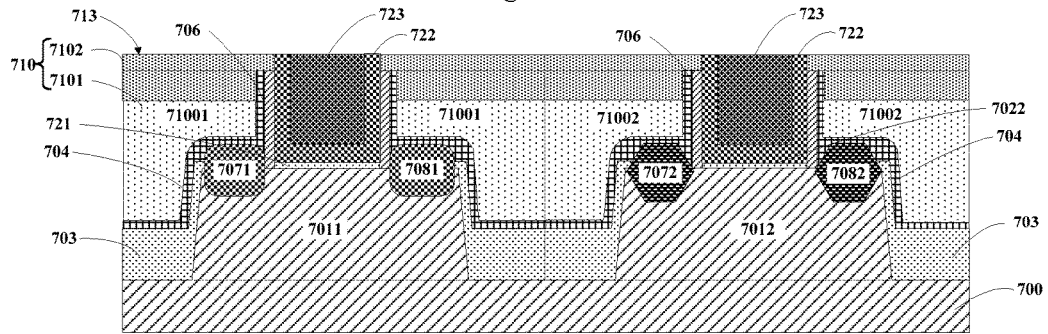

Next, referring to FIG. 7I, after the pseudo gate insulation layer in the first cavity 7111 is removed, a gate insulation layer 721 is formed at least on the exposed portion of the first source region 7011, then a high-K dielectric layer 722 is formed in the first cavity 7111 and the second cavity 7112 along the sidewall and the base, leaving an unfilled portions in the cavities 7111, 7112. A gate electrode 723 is formed in the unfilled portions of the cavities 7111, 7112, and on the high-K dielectric layer 722.

This concludes the description of a semiconductor device manufacturing method in accordance with one or more embodiments of this inventive concept. In this manufacturing method, a second insulation layer is formed on the first insulation layer, which increases the thickness of the interlayer dielectric layer and further reduces the loss of interlayer dielectric layer. Therefore the height loss of the gate electrode can be further reduced in succeeding processes. Additionally, in this manufacturing method, the ion implantation process is conducted on at least two devices. After the ion implantation process, the pseudo gate insulation layer on at least one source region is removed, and a gate structure is formed there.

This manufacturing method reduces the loss of interlayer dielectric layer, which in turn reduces the height loss of the gate electrode. Thus, this manufacturing method allows a lower pseudo gate electrode and a higher gate electrode than those in conventional methods. Hence, the manufacturing method of this inventive concept provides more manufacturing margin than conventional methods and helps to improve product yield.

This concludes the description of a semiconductor device and its manufacturing method in accordance with one or more embodiments of this inventive concept. For the purpose of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device manufacturing method, comprising:
providing a semiconductor structure, wherein the semiconductor structure comprises:
a substrate;
at least one source region on the substrate;
an interlayer dielectric layer covering a portion of the source region, wherein the interlayer dielectric layer has a cavity on the source region; and
a pseudo gate insulation layer at a bottom of the cavity covering a portion of the source region,
wherein providing the semiconductor structure comprises:
providing an initial structure, wherein the initial structure comprises:
the substrate;
the at least one source region on the substrate;
a pseudo gate structure on the source region, wherein the pseudo gate structure comprises the pseudo gate insulation layer on the source region and a pseudo gate electrode on the pseudo gate insulation layer; and
the interlayer dielectric layer around the pseudo gate structure, wherein an upper surface of the interlayer dielectric layer is on a same horizontal level as an upper surface of the pseudo gate electrode; and
forming a barrier layer in the cavity, wherein an upper surface of the barrier layer is lower than a top position of the cavity;
forming a loss reduction region in the interlayer dielectric layer by conducting an ion implantation process comprising silicon ion or carbon ion on the semiconductor structure;
removing the barrier layer;
removing the pseudo gate insulation layer to expose a portion of the source region; and
forming a gate structure on the exposed portion of the source region.

2. The method of claim 1, wherein a dopant used in the ion implantation process comprises silicon ion, carbon ion, or an ionic group comprising silicon or carbon.

3. The method of claim 1, wherein the gate structure comprises:
a gate insulation layer on the exposed portion of the source region;
a high-K dielectric layer on the gate insulation layer; and
a gate electrode on the high-K dielectric layer.

4. The method of claim 3, wherein forming the gate structure on the exposed portion of the source region comprises:
forming the gate insulation layer on the exposed portion of the source region;
forming the high-K dielectric layer on the gate insulation layer covering the semiconductor structure;
forming a gate material layer on the high-K dielectric layer; and
forming the gate structure by conducting a planarization process on the semiconductor structure after the gate material layer is formed.

5. The method of claim 1, wherein the barrier layer comprises a Bottom Anti-Reflective Coating (BARC) layer or a photoresist.

6. The method of claim 1, wherein forming the barrier layer in the cavity comprises:
forming the barrier layer filling the cavity on the semiconductor structure; and
removing a portion of the barrier layer so that the remaining barrier layer partially fills the cavity.

7. The method of claim 1, wherein the source region comprises a first source region for a first device and a second source region for a second device, wherein the interlayer dielectric layer comprises a first part of the interlayer dielectric layer covering a portion of the first source region and a second part of the interlayer dielectric layer covering a portion of the second source region, and wherein the cavity comprises a first cavity on the first source region and a second cavity on the second source region.

8. The method of claim 7, wherein removing the pseudo gate insulation layer comprises:
forming a hard mask layer on the second part of the interlayer dielectric layer and in the second cavity;
removing the pseudo gate insulation layer in the first cavity to expose a portion of the first source region; and
removing the hard mask layer.

9. The method of claim 8, further comprising:
conducting a thermal annealing process on the semiconductor structure with the loss reduction region after the barrier layer is removed but before the hard mask layer is formed.

10. The method of claim 8, wherein forming the gate structure comprises:
forming a gate insulation layer on the expose portion of the first source region;
forming a high-K dielectric layer in the first cavity and in the second cavity; and
forming a gate electrode on the high-K dielectric layer.

11. The method of claim 7, wherein removing the pseudo gate insulation layer comprises:
forming a cover layer on the second part of the interlayer dielectric layer and in the second cavity;
forming a hard mask layer on the cover layer;
removing the pseudo gate insulation layer in the first cavity to expose a portion of the first source region; and
removing the hard mask layer and the cover layer.

12. The method of claim 11, further comprising:
conducting a thermal annealing process on the semiconductor structure with the loss reduction region after the barrier layer is removed but before the cover layer is formed.

13. The method of claim 7, wherein removing the barrier layer comprises:
removing the barrier layer in the first cavity,
and wherein removing the pseudo gate insulation layer comprises:
forming a hard mask layer on the second part of the interlayer dielectric layer and on the barrier layer in the second cavity;
removing the pseudo gate insulation layer in the first cavity to expose a portion of the first source region; and
removing the hard mask layer and the barrier layer in the second cavity.

14. The method of claim 7, wherein removing the barrier layer comprises:
  removing the barrier layer in the first cavity,
  and wherein removing the pseudo gate insulation layer comprises:
    forming a cover layer on the second part of the interlayer dielectric layer and on the barrier layer in the second cavity;
    forming a hard mask layer on the cover layer;
    removing the pseudo gate insulation layer in the first cavity to expose a portion of the first source region; and
    removing the hard mask layer, the cover layer and the barrier layer in the second cavity.

15. The method of claim 1, wherein the semiconductor structure further comprises:
  a source electrode and a drain electrode in the source region and each at a side of the cavity; and
  a spacer on a sidewall of the cavity.

16. The method of claim 15, further comprising:
  forming a groove around the source region,
  and wherein the semiconductor structure further comprises:
    a third insulation layer at least partially filling the groove; and
    a fourth insulation layer covering the third insulation layer, the source electrode, and the drain electrode, wherein the interlayer dielectric layer is formed on the fourth insulation layer.

17. The method of claim 1, wherein the source region is a semiconductor fin or a source region for a planar semiconductor device.

18. A semiconductor device manufacturing method, comprising:
  providing a semiconductor structure, wherein the semiconductor structure comprises:
    a substrate;
    at least one source region on the substrate;
    an interlayer dielectric layer covering a portion of the source region, wherein the interlayer dielectric layer has a cavity on the source region; and
    a pseudo gate insulation layer at a bottom of the cavity covering a portion of the source region,
    wherein the interlayer dielectric layer comprises a first insulation layer on the source region and a second insulation layer on the first insulation layer, and
  wherein providing the semiconductor structure comprises:
    providing an initial structure, wherein the initial structure comprises:
      the substrate;
      the at least one source region on the substrate;
      a pseudo gate structure on the source region, wherein the pseudo gate structure comprises the pseudo gate insulation layer on the source region and a pseudo gate electrode on the pseudo gate insulation layer; and
      the first insulation layer around the pseudo gate structure, wherein an upper surface of the first insulation layer is on a same horizontal level as an upper surface of the pseudo gate electrode;
    removing the pseudo gate electrode to form the cavity; and
    forming the second insulation layer on the first insulation layer and on the bottom and a sidewall of the cavity;
  forming a barrier layer in the cavity, wherein an upper surface of the barrier layer is lower than a top position of the cavity, wherein the barrier layer is formed on the second insulation layer;
  forming a loss reduction region in the interlayer dielectric layer by conducting an ion implantation process comprising silicon ion or carbon ion on the semiconductor structure;
  removing the barrier layer;
  removing the pseudo gate insulation layer to expose a portion of the source region; and
  forming a gate structure on the exposed portion of the source region.

19. The method of claim 18, further comprising removing the second insulation layer in the cavity after the barrier layer is removed but before the pseudo gate insulation layer is removed.

20. The method of claim 19, further comprising conducting a thermal annealing process on the semiconductor structure with the loss reduction region after the barrier layer is removed but before the second insulation layer in the cavity is removed.

* * * * *